(12) United States Patent
Shibasaki

(10) Patent No.: US 8,983,014 B2
(45) Date of Patent: Mar. 17, 2015

(54) RECEIVER CIRCUIT AND SEMICONDUCTOR INTEGRATED CIRCUIT

(71) Applicant: Fujitsu Limited, Kawasaki-shi, Kanagawa (JP)

(72) Inventor: Takayuki Shibasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/170,901

(22) Filed: Feb. 3, 2014

(65) Prior Publication Data

US 2014/0286381 A1    Sep. 25, 2014

(30) Foreign Application Priority Data

Mar. 22, 2013  (JP) .................. 2013-060680

(51) Int. Cl.
*H04L 7/00* (2006.01)
*H04L 7/033* (2006.01)
*H04L 25/03* (2006.01)

(52) U.S. Cl.
CPC .............. *H04L 7/0334* (2013.01); *H04L 25/03* (2013.01)
USPC ......................... 375/355; 375/354

(58) Field of Classification Search
USPC .......................................... 375/355
See application file for complete search history.

(56) References Cited

FOREIGN PATENT DOCUMENTS

| JP | 02-111130 | 4/1990 |
|----|-----------|--------|
| JP | 11-196142 | 7/1999 |
| JP | 2002-300142 | 10/2002 |

*Primary Examiner* — Erin File
(74) *Attorney, Agent, or Firm* — Fujitsu Patent Center

(57) ABSTRACT

In a receiver circuit which can correct a deviation of phase between an input signal and a clock, a sampler detects an amplitude level of the input signal at timing indicated by the clock, a first comparison circuit compares a first and a second amplitude level detected by the sampler at first and second timings, respectively, with a determined threshold, an interpolation circuit calculates an intermediate level that approximates to an amplitude level of the input signal corresponding to an intermediate point between the first and second timings by an interpolation process based on the first and second amplitude levels, a second comparison circuit compares the intermediate level with the determined threshold, and a phase deviation detection circuit detects the deviation of phase between the clock and the input signal on the basis of comparison results obtained by the first and second comparison circuits.

8 Claims, 17 Drawing Sheets

| $D_{dc}[n-1]$ | $D_{de}[n]$ | $D_{dc}[n]$ | UP | DN | UP/DN |
|---|---|---|---|---|---|
| 0 | 0 | 0 | 0 | 0 | 0 |
| 0 | 0 | 1 | 0 | 1 | −1 |
| 0 | 1 | 0 | 1 | 1 | 0 |
| 0 | 1 | 1 | 1 | 0 | +1 |
| 1 | 0 | 0 | 1 | 0 | +1 |
| 1 | 0 | 1 | 1 | 1 | 0 |
| 1 | 1 | 0 | 0 | 1 | −1 |
| 1 | 1 | 1 | 0 | 0 | 0 |

FIG. 6

| $D_{dc}[n-2]$ | $D_{dc}[n-1]$ | $D_{de}[n]$ | $D_{dc}[n]$ | $D_{dc}[n+1]$ | UP/DN |
|---|---|---|---|---|---|
| 0 | 0 | 0 | 1 | 1 | −1 |
| 0 | 0 | 1 | 1 | 1 | +1 |
| 1 | 1 | 0 | 0 | 0 | +1 |
| 1 | 1 | 1 | 0 | 0 | −1 |
| Other | | | | | 0 |

FIG. 7

(A) CASE WHERE LOSS IS SMALLER THAN DETERMINED THRESHOLD

| $D_{dc}[n-2]$ | $D_{dc}[n-1]$ | $D_{dc}[n]$ | $D_{dc}[n]$ | $D_{dc}[n+1]$ | UP/DN |
|---|---|---|---|---|---|
| 0 | 0 | 0 | 1 | * | -1 |
| * | 0 | 1 | 1 | 1 | +1 |
| * | 1 | 0 | 0 | 0 | +1 |
| 1 | 1 | 1 | 0 | * | -1 |
| Other | | | | | 0 |

(B) CASE WHERE LOSS IS GREATER THAN DETERMINED THRESHOLD

| $D_{dc}[n-2]$ | $D_{dc}[n-1]$ | $D_{dc}[n]$ | $D_{dc}[n]$ | $D_{dc}[n+1]$ | UP/DN |
|---|---|---|---|---|---|
| 0 | 0 | 0 | 1 | 1 | -1 |
| 0 | 0 | 1 | 1 | 1 | +1 |
| 1 | 1 | 0 | 0 | 0 | +1 |
| 1 | 1 | 1 | 0 | 0 | -1 |
| Other | | | | | 0 |

RECEIVER CIRCUIT AND SEMICONDUCTOR INTEGRATED CIRCUIT

CROSS-REFERENCE TO RELATED APPLICATION

This application is based upon and claims the benefit of priority of the prior Japanese Patent Application No. 2013-060680, filed on Mar. 22, 2013, the entire contents of which are incorporated herein by reference.

FIELD

The embodiments discussed herein are related to a receiver circuit and a semiconductor integrated circuit.

BACKGROUND

With improvement in the performance of information processing apparatus, in recent years the data rates of data signals transmitted from the inside and received from the outside of the apparatus have been increased. In a receiver circuit which receives a data signal, an amplitude level of the data signal is decided at a timing to a sampling clock and data recovery is performed on the basis of a decision result. When a data rate is high, a slight deviation of phase between a data signal and a sampling clock has an influence on data detection accuracy. Accordingly, a technique called tracking CDR (Clock and Data Recovery) for detecting such a phase deviation and synchronizing a phase of a sampling clock to a phase of a data signal is used.

A technique called baud rate tracking CDR is known as one of techniques for realizing the tracking CDR. With this technique 1-bit data is sampled once. A technique for calculating an autocorrelation function of a signal sequence obtained by sampling a data signal at a sampling rate which is equal to a transmission baud rate and controlling a sampling phase so as to maximize a calculated value is proposed as an example.

In addition, a technique called 2× tracking CDR is known. With this technique 1-bit data is sampled twice. For example, a technique for preparing a clock other than a data detection clock to detect an edge portion (zero-crossing point) of a data signal and detecting a deviation of phase between the data detection clock and the data signal on the basis of an amplitude level detected by the clock is proposed. The phase deviation is detected with the amplitude level at the zero-crossing point of the data signal as reference. This curbs the influence of variations in the amplitude of a data signal caused by the influence of transmission line loss, noise, or the like on detection accuracy. Accordingly, a phase deviation can be detected with greater accuracy.

Japanese Laid-open Paten Publication No. 02-111130
Japanese Laid-open Paten Publication No. 2002-300142

With a receiver circuit in which the 2× tracking CDR is adopted, a special sampling circuit which samples a data signal by a clock other than a data detection clock is included. That is to say, a special sampling circuit for detecting an amplitude level at a zero-crossing point of a data signal is included, so circuit size increases.

SUMMARY

According to an aspect, there is provided a receiver circuit including a sampling circuit which detects an amplitude level of an input data signal at a sampling timing indicated by a sampling clock, a first comparison circuit which compares a first amplitude level and a second amplitude level detected by the sampling circuit at a first sampling timing and a second sampling timing, respectively, with a determined threshold, an interpolation circuit which calculates an intermediate level that approximates to an amplitude level of the input data signal corresponding to an intermediate point between the first sampling timing and the second sampling timing by an interpolation process based on the first amplitude level and the second amplitude level, a second comparison circuit which compares the intermediate level with the determined threshold, and a phase deviation detection circuit which detects a deviation of phase between the sampling clock and the input data signal on the basis of results of comparisons made by the first comparison circuit and the second comparison circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 indicates the relationships among inputs to and outputs from the phase detection circuit in the second embodiment;

FIG. 7 is an example of a 4-bit pattern filter in the second embodiment;

DESCRIPTION OF EMBODIMENTS

Figure 1:
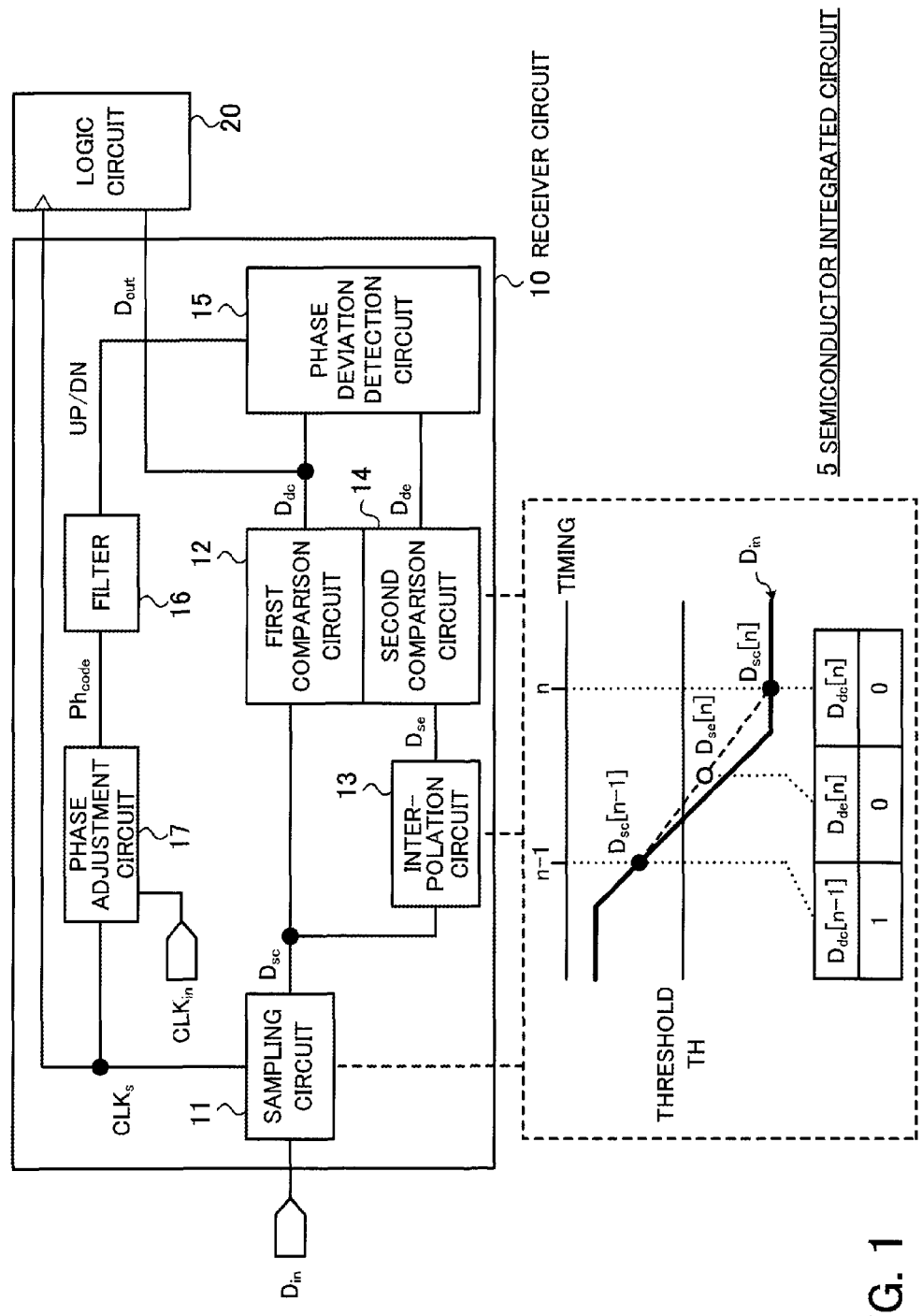
FIG. 1 is an example of a receiver circuit according to a first embodiment.

Embodiments will now be described with reference to the accompanying drawings, wherein like reference numerals refer to like elements throughout.

First Embodiment

A first embodiment will be described.
A receiver circuit 10 according to a first embodiment will be described with reference to FIG. 1.

FIG. 1 is an example of a receiver circuit according to a first embodiment.

As illustrated in FIG. 1, a receiver circuit 10 includes a sampling circuit 11, a first comparison circuit 12, an interpolation circuit 13, a second comparison circuit 14, and a phase deviation detection circuit 15. In addition, the receiver circuit 10 includes a filter 16 and a phase adjustment circuit 17.

The sampling circuit 11 detects an amplitude level of an input data signal $D_{in}$ at a sampling timing indicated by a sampling clock. In the example of FIG. 1, an amplitude level of the input data signal $D_{in}$ is sampled at a first sampling timing and a second sampling timing. In this example, the sampling circuit 11 detects a first amplitude level $D_{sc}[n-1]$ at the first sampling timing and detects a second amplitude level $D_{sc}[n]$ at the second sampling timing.

The first amplitude level $D_{sc}[n-1]$ and the second amplitude level $D_{sc}[n]$ detected by the sampling circuit 11 are inputted to the first comparison circuit 12 and the interpolation circuit 13. The first comparison circuit 12 compares the first amplitude level $D_{sc}[n-1]$ and the second amplitude level $D_{sc}[n]$ detected by the sampling circuit 11 at the first sampling timing and the second sampling timing, respectively, with a determined threshold Th. The determined threshold Th is set to an intermediate value of an amplitude level of the input data signal $D_{in}$. For example, the determined threshold Th is set to a level which passes through the center of an eye (or a zero-crossing point) on an eye pattern.

In the example of FIG. 1, the first amplitude level $D_{sc}[n-1]$ and the second amplitude level $D_{sc}[n]$ are compared with the determined threshold Th at a falling edge portion of the input data signal $D_{in}$. In this example, the first amplitude level $D_{sc}[n-1]$ is higher than the determined threshold Th, so the first comparison circuit 12 outputs "1" as a first bit value $D_{dc}[n-1]$ which is a comparison result on the first amplitude level $D_{sc}[n-1]$. On the other hand, the second amplitude level $D_{sc}[n]$ is lower than the determined threshold Th, so the first comparison circuit 12 outputs "0" as a second bit value $D_{dc}[n]$ which is a comparison result on the second amplitude level $D_{sc}[n]$.

The first bit value $D_{dc}[n-1]$ and the second bit value $D_{dc}[n]$, which are the results of the comparisons made by the first comparison circuit 12, are outputted in order to the outside as data $D_{out}$. Furthermore, the first bit value $D_{dc}[n-1]$ and the second bit value $D_{dc}[n]$ are inputted in order to the phase deviation detection circuit 15.

The interpolation circuit 13 calculates an intermediate level $D_{sc}[n]$ which approximates to an amplitude level of the input data signal $D_{in}$ corresponding to an intermediate point between the first sampling timing and the second sampling timing by an interpolation process based on the first amplitude level $D_{sc}[n-1]$ and the second amplitude level $D_{sc}[n]$. As stated above, the first comparison circuit 12 performs a comparison process on the first amplitude level $D_{sc}[n-1]$ and the second amplitude level $D_{sc}[n]$ inputted in order. On the other hand, the interpolation circuit 13 holds the first amplitude level $D_{sc}[n-1]$ inputted first, and calculates the intermediate level $D_{sc}[n]$ at a timing at which the second amplitude level $D_{sc}[n]$ is inputted after. Therefore, the interpolation circuit 13 includes a holding section (not illustrated) for holding the first amplitude level $D_{sc}[n-1]$.

The intermediate level $D_{se}[n]$ calculated by the interpolation circuit 13 is inputted to the second comparison circuit 14. The second comparison circuit 14 compares the intermediate level $D_{se}[n]$ with a determined threshold Th. The determined threshold Th used by the second comparison circuit 14 is equal in value to the determined threshold Th used by the first comparison circuit 12.

In the example of FIG. 1, a phase of the sampling clock is slower than a phase of the input data signal $D_{in}$. In this case, an amplitude level detected at the falling edge portion (amplitude level at a zero-crossing point) of the input data signal $D_{in}$ at the intermediate point between the first sampling timing and the second sampling timing is lower than the determined threshold Th. In this case, the intermediate level $D_{se}[n]$ which approximates to the amplitude level at the zero-crossing point is also lower than the determined threshold Th. Accordingly, the second comparison circuit 14 outputs "0" as a bit value $D_{de}[n]$ which is a comparison result on the intermediate level $D_{se}[n]$.

The bit value $D_{de}[n]$, which is the result of the comparison made by the second comparison circuit 14, is inputted to the phase deviation detection circuit 15. The phase deviation detection circuit 15 detects a deviation of phase between the sampling clock and the input data signal $D_{in}$ on the basis of the first bit value $D_{dc}[n-1]$, the second bit value $D_{dc}[n]$, and the bit value $D_{de}[n]$.

In the example of FIG. 1, the first bit value $D_{dc}[n-1]$ is "1" and the second bit value $D_{dc}[n]$ is "0". This indicates a falling edge portion of the input data signal $D_{in}$. In addition, the bit value $D_{de}[n]$ is "0". This indicates that a phase of the sampling clock is slower than a phase of the input data signal $D_{in}$. In this case, the phase deviation detection circuit 15 outputs a signal (UP/DN signal=+1) for exercising control so as to set forward a phase of the sampling clock. A phase of the sampling clock used by the sampling circuit 11 is adjusted on the basis of the UP/DN signal outputted from the phase deviation detection circuit 15.

For convenience of explanation the function and operation of each circuit have been described with attention paid to the first sampling timing and the second sampling timing. However, a phase deviation is detected and adjusted in order according to an amplitude level of the input data signal $D_{in}$ sampled at each sampling timing in the same way that is described above. At this time a high-frequency component of an UP/DN signal outputted from the phase deviation detection circuit 15 is removed by the filter 16. Then the UP/DN signal is inputted to the phase adjustment circuit 17 as a phase adjustment signal $Ph_{code}$. The phase adjustment circuit 17 adjusts a phase of a clock $CLK_{in}$ supplied from the outside according to the phase adjustment signal $Ph_{code}$ and supplies to the sampling circuit 11a sampling clock $CLK_s$ which is a clock after the adjustment.

By adopting the above mechanism, the receiver circuit 10 can realize the function of correcting a deviation of phase between the input data signal $D_{in}$ and the sampling clock. As stated above, the receiver circuit makes the interpolation circuit 13 calculate the intermediate level $D_{se}[n]$ which approximates to an amplitude level at the zero-crossing point by an interpolation process and makes the phase deviation detection circuit 15 detect a phase deviation by the use of the intermediate level $D_{se}[n]$. Accordingly, a special sampling circuit for detecting an amplitude level at the zero-crossing point is not included. This checks an increase in circuit scale. Furthermore, a phase deviation is detected by the use of the intermediate level $D_{se}[n]$. As a result, even if the amplitude of the input data signal $D_{in}$ varies by the influence of transmission line loss, process variations at production time, temperature variations at operation time, noise, or the like, the accuracy of the detection of a phase deviation hardly deteriorates.

The first embodiment has been described. As illustrated in FIG. 1, the receiver circuit 10 may be connected to a logic circuit 20 to form a semiconductor integrated circuit 5.

Second Embodiment

A second embodiment will be described.
(Overview of Phase Deviation Detection Method)

Figure 2:
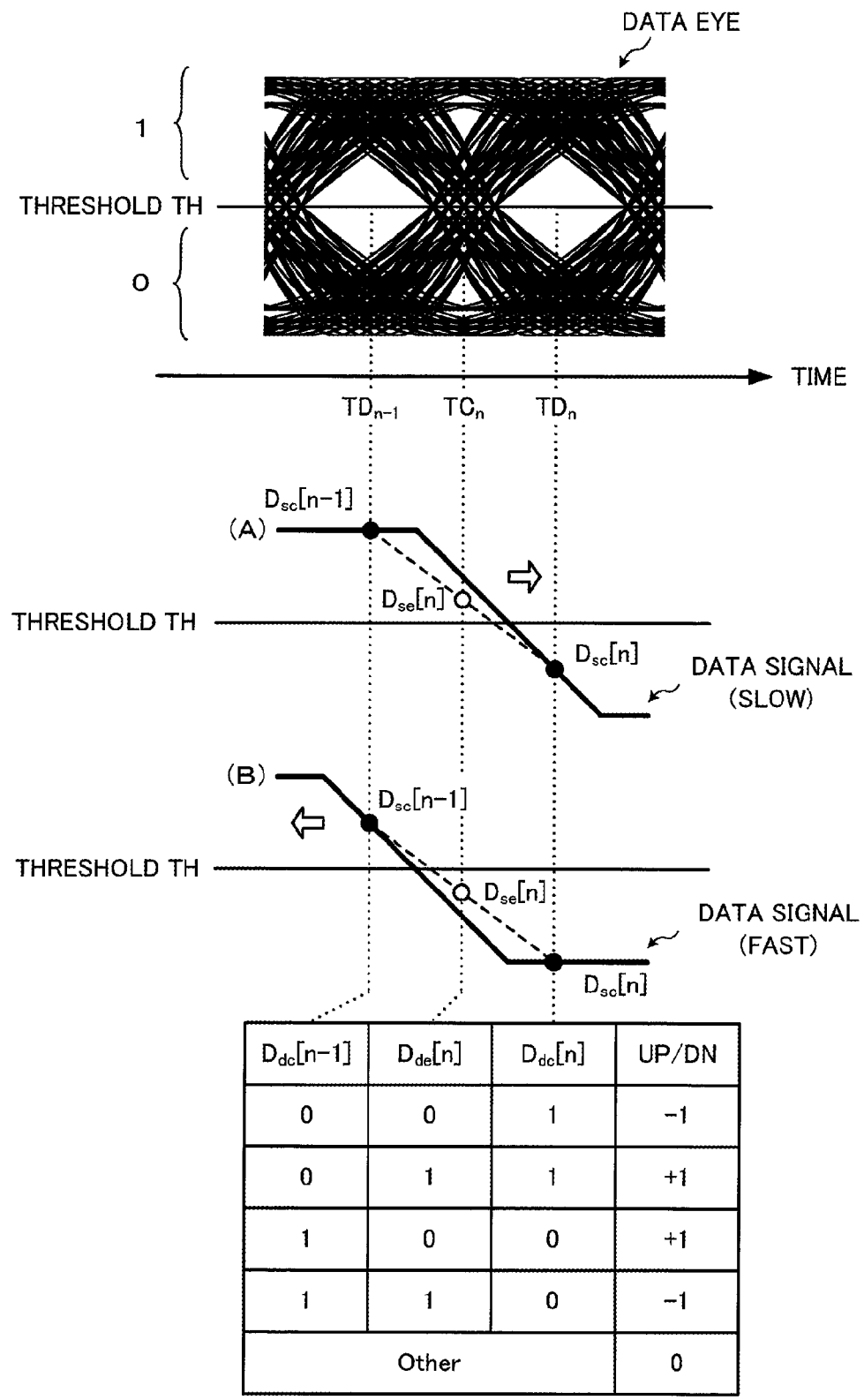
FIG. 2 illustrates a phase deviation detection method according to a second embodiment.

First an overview of a phase deviation detection method according to a second embodiment will be given with reference to FIG. 2. FIG. 2 illustrates a phase deviation detection method according to a second embodiment.

FIG. 2 schematically illustrates an eye pattern of an input data signal $D_{in}$. Usually the input data signal $D_{in}$ is sampled at a sampling timing which is near the center of an eye on the eye pattern. In the example of FIG. 2, the input data signal $D_{in}$ is sampled at a sampling timing $TD_{n-1}$ and a sampling timing $TD_n$ (cycle of sampling timing is set to a constant value). In this specification a timing $TC_n$ which is intermediate between the sampling timing $TD_{n-1}$ and the sampling timing $TD_n$ is referred to as a zero-crossing point.

As illustrated in FIG. 2, a threshold Th used for deciding data from an amplitude level of the input data signal $D_{in}$ is set to a level (which may be referred to as a zero level) which passes through the center of the eye on the eye pattern. It is assumed that if an amplitude level is higher than the threshold Th, the decision that a bit value is "1" is made, and that if an amplitude level is lower than the threshold Th, the decision that a bit value is "0" is made.

FIG. 2 illustrates a signal waveform obtained in case (A) where a phase of a sampling clock is slower than a phase of the input data signal $D_{in}$ and a signal waveform obtained in case (B) where a phase of the sampling clock is faster than a phase of the input data signal $D_{in}$. As illustrated in FIG. 2, if a phase of the sampling clock is slow at a falling edge portion of the input data signal $D_{in}$, that is to say, in the case of (A), an amplitude level at the zero-crossing point of the input data signal $D_{in}$ is higher than the threshold Th. On the other hand, if a phase of the sampling clock is fast, that is to say, in the case of (B), an amplitude level at the zero-crossing point of the input data signal $D_{in}$ is lower than the threshold Th.

That is to say, whether an edge portion of the input data signal $D_{in}$ is a falling edge portion or a rising edge portion is decided and whether or not an amplitude level at the zero-crossing point of the input data signal $D_{in}$ is higher than the threshold Th is decided. By doing so, a phase deviation of the sampling clock can be detected. Even if the amplitude of the input data signal $D_{in}$ varies by the influence of transmission line loss, process variations at production time, temperature variations at operation time, noise, or the like, an amplitude level of the input data signal $D_{in}$ detected at the zero-crossing point does not change much. Accordingly, by detecting a phase deviation by the use of an amplitude level at the zero-crossing point of the input data signal $D_{in}$, the influence of the variations in the amplitude of the input data signal $D_{in}$ on detection accuracy is reduced.

In the second embodiment, as illustrated in FIG. 2, the method of detecting a phase deviation with an amplitude level at the zero-crossing point of the input data signal $D_{in}$ as reference is adopted. However, the input data signal $D_{in}$ is not sampled at the zero-crossing point. Amplitude levels of the input data signal $D_{in}$ sampled at the sampling timing $TD_{n-1}$ and the sampling timing $TD_n$ are used. To be concrete, amplitude levels $D_{sc}[n-1]$ and $D_{sc}[n]$ detected at the sampling timing $TD_{n-1}$ and the sampling timing $TD_n$, respectively, are used for performing an interpolation process, and an intermediate level $D_{se}[n]$ which approximates to an amplitude level at the zero-crossing point of the input data signal $D_{in}$ is used. That is to say, the intermediate level $D_{se}[n]$ is compared with the threshold Th and a phase deviation of the sampling clock is detected.

As illustrated in FIG. 2, the amplitude level $D_{sc}[n-1]$ is higher than the threshold Th at the falling edge portion of the input data signal $D_{in}$. Furthermore, the amplitude level $D_{sc}[n]$ is lower than the threshold Th at the falling edge portion of the input data signal $D_{in}$. In this case, a bit value $D_{dc}[n-1]$ indicative of a comparison result on the amplitude level $D_{sc}[n-1]$ is "1" and a bit value $D_{dc}[n]$ indicative of a comparison result on the amplitude level $D_{sc}[n]$ is "0". If a phase of the sampling clock is slow, that is to say, in the case of (A), the intermediate level $D_{se}[n]$ is higher than the threshold Th and a bit value $D_{de}[n]$ indicative of a comparison result on the intermediate level $D_{se}[n]$ is "1". Conversely, if a phase of the sampling clock is fast, that is to say, in the case of (B), the intermediate level $D_{se}[n]$ is lower than the threshold Th and a bit value $D_{de}[n]$ indicative of a comparison result on the intermediate level $D_{se}[n]$ is "0".

On the other hand, the amplitude level $D_{sc}[n-1]$ is lower than the threshold Th at a rising edge portion of the input data signal $D_{in}$. Furthermore, the amplitude level $D_{sc}[n]$ is higher than the threshold Th at the rising edge portion of the input data signal $D_{in}$. In this case, the bit value $D_{dc}[n-1]$ indicative of a comparison result on the amplitude level $D_{sc}[n-1]$ is "0" and the bit value $D_{dc}[n]$ indicative of a comparison result on the amplitude level $D_{sc}[n]$ is "1". In addition, if a phase of the sampling clock is slow, the intermediate level $D_{se}[n]$ is lower than the threshold Th and the bit value $D_{de}[n]$ indicative of a comparison result on the intermediate level $D_{se}[n]$ is Conversely, if a phase of the sampling clock is fast, the intermediate level $D_{se}[n]$ is higher than the threshold Th and the bit value $D_{de}[n]$ indicative of a comparison result on the intermediate level $D_{se}[n]$ is "1".

A phase deviation of the sampling clock can be detected in this way by a combination of the bit values $D_{dc}[n-1]$, $D_{de}[n]$, and $D_{dc}[n]$. A table in which such combinations are enumerated is indicated in the lowermost part of FIG. 2. An UP/DN column is included in the table indicated in FIG. 2. A value in the UP/DN column (hereinafter referred to as an UP/DN signal) indicates a direction in which a phase of the sampling clock is adjusted. For example, if an UP/DN signal is "+1", then an adjustment is made in a direction in which a phase of the sampling clock is set forward. On the other hand, if an UP/DN signal is "−1", then an adjustment is made in a direction in which a phase of the sampling clock is set back.

A combination of the bit value $D_{dc}[n-1]$ "0", the bit value $D_{de}[n]$ "0", and the bit value $D_{dc}[n]$ "1" indicates that a phase of the sampling clock is fast. Accordingly, an UP/DN signal is set to "−1" so as to make an adjustment for setting back a phase of the sampling clock. Conversely, a combination of the bit value $D_{dc}[n-1]$ "0", the bit value $D_{de}[n]$ "1", and the bit value $D_{dc}[n]$ "1" indicates that a phase of the sampling clock is slow. Accordingly, an UP/DN signal is set to "+1" so as to make an adjustment for setting forward a phase of the sampling clock.

Similarly, a combination of the bit value $D_{dc}[n-1]$ "1", the bit value $D_{de}[n]$ "0", and the bit value $D_{dc}[n]$ "0" indicates that a phase of the sampling clock is slow. Accordingly, an UP/DN signal is set to "+1" so as to make an adjustment for setting forward a phase of the sampling clock. Conversely, a combination of the bit value $D_{dc}[n-1]$ "1", the bit value $D_{de}[n]$ "1", and the bit value $D_{dc}[n]$ "0" indicates that a phase of the sampling clock is fast. Accordingly, an UP/DN signal is set to "−1" so as to make an adjustment for setting back a phase of the sampling clock.

With a combination (Other) other than the above four combinations, sampling is not performed at an edge portion of the input data signal $D_{in}$ or a normal value is not detected due to some error. Therefore, an UP/DN signal is set to "0". That is to say, in such a case, a phase of the sampling clock is not adjusted.

The overview of the phase deviation detection method according to the second embodiment has been given. An example of a receiver circuit by which the phase deviation detection method can be realized, its operation, and the like will now be described. In the example of FIG. 2, a phase deviation of the sampling clock is detected by a pattern obtained by combining 2-bit values. For example, a method for adjusting a phase deviation of a sampling clock by the use of a pattern obtained by combining 4-bit values will also be described later.

(Example of Receiver Circuit)

Figure 3:
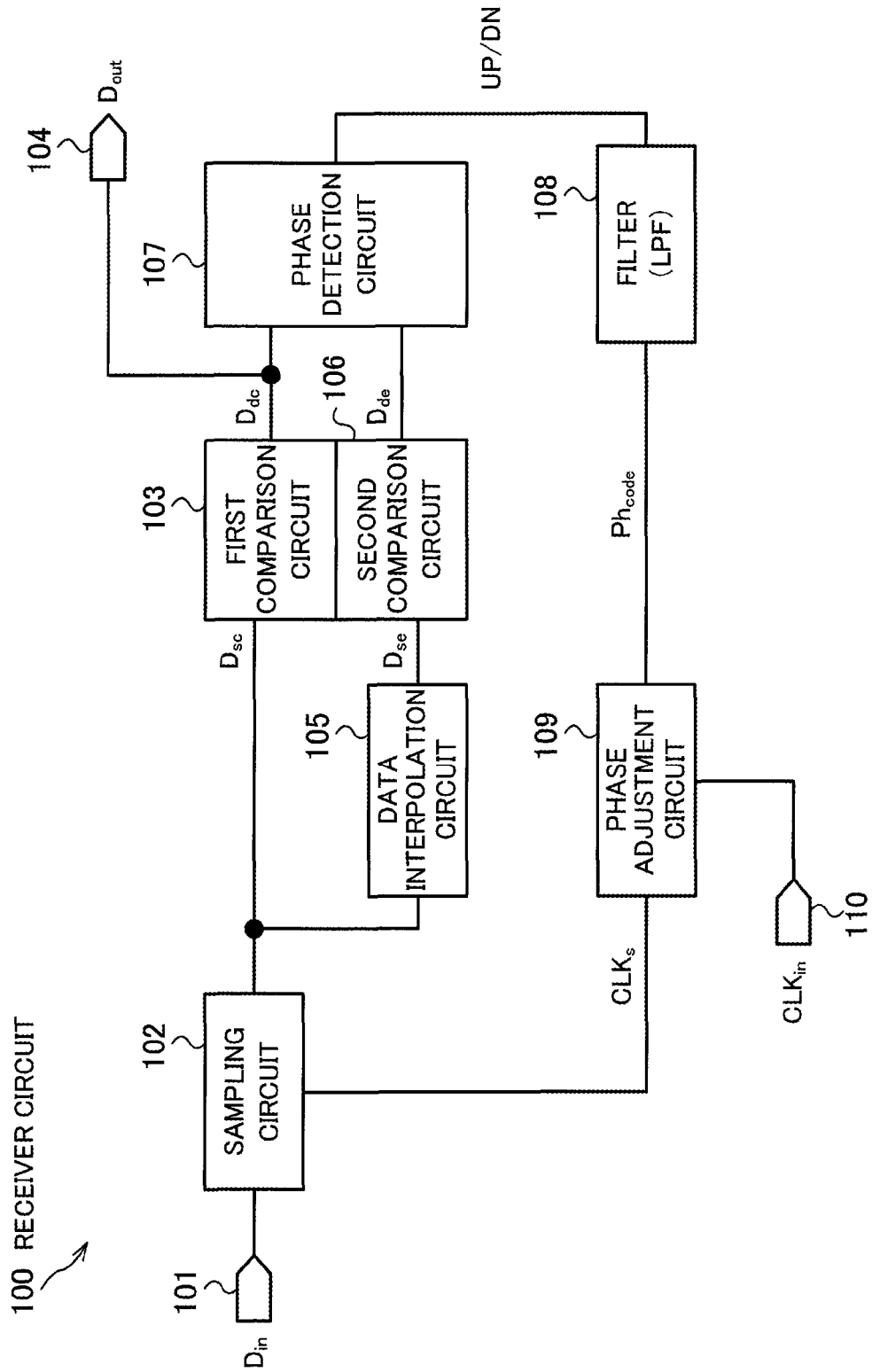
FIG. 3 is an example of a receiver circuit according to the second embodiment.

Next, an example of a receiver circuit 100 according to the second embodiment will be described with reference to FIG. 3. FIG. 3 is an example of a receiver circuit according to the second embodiment.

As illustrated in FIG. 3, a receiver circuit 100 includes a data input terminal 101, a sampling circuit 102, a first comparison circuit 103, and a data output terminal 104. In addition, the receiver circuit 100 includes a data interpolation circuit 105, a second comparison circuit 106, a phase detection circuit 107, a filter 108, a phase adjustment circuit 109, and a clock input terminal 110.

An input data signal $D_{in}$ is inputted to the data input terminal 101. The input data signal $D_{in}$ is inputted to the sampling circuit 102. The sampling circuit 102 detects an amplitude level $D_{sc}$ of the input data signal $D_{in}$ at a sampling timing indicated by a sampling clock $CLK_s$. In the following description the amplitude level $D_{sc}$ of the input data signal $D_{in}$ detected by the sampling circuit 102 at a sampling timing $TD_n$ may be represented as $D_{sc}[n]$. The amplitude level $D_{sc}$ detected by the sampling circuit 102 is inputted to the first comparison circuit 103 and the data interpolation circuit 105.

The first comparison circuit 103 compares the amplitude level $D_{sc}$ inputted from the sampling circuit 102 with a determined threshold Th. If the amplitude level $D_{sc}$ is higher than the determined threshold Th, then the first comparison circuit 103 outputs the bit value "1" as a comparison result $D_{dc}$. If the amplitude level $D_{sc}$ is lower than the determined threshold Th, then the first comparison circuit 103 outputs the bit value "0" as a comparison result $D_{dc}$. The bit value $D_{dc}$ indicative of a comparison result is outputted as received data $D_{out}$ from the data output terminal 104 to the outside of the receiver circuit 100. In addition, the bit value $D_{dc}$ is inputted to the phase detection circuit 107.

The data interpolation circuit 105 holds the amplitude level $D_{sc}$ inputted from the sampling circuit 102 in a holding section (not illustrated). The data interpolation circuit 105 performs an interpolation process by the use of two amplitude levels $D_{sc}$ detected at two sampling timings to find an intermediate level $D_{se}$ which approximates to an amplitude level of the input data signal $D_{in}$ at an intermediate point (zero-crossing point) between the two sampling timings. For example, the data interpolation circuit 105 finds an intermediate value between the two amplitude levels $D_{sc}$ and considers the found intermediate value as the intermediate level $D_{se}$.

In the example of FIG. 2, the method of finding the intermediate level $D_{se}[n]$ for the two adjacent sampling timings $TD_{n-1}$ and $TD_n$ is indicated. However, the two sampling timings may not be adjacent to each other. For example, the data interpolation circuit 105 may consider as the intermediate level $D_{se}$ an intermediate value between amplitude levels $D_{sc}[n-2]$ and $D_{sc}[n+1]$ of the input data signal $D_{in}$ detected at two sampling timings $TD_{n-2}$ and $TD_{n+1}$.

Furthermore, in the following description a linear interpolation is used as an interpolation method. However, a nonlinear interpolation, such as a polynomial interpolation or a spline interpolation, may be used. If a nonlinear interpolation is used, the data interpolation circuit 105 uses amplitude levels $D_{sc}$ detected at three or more sampling timings. A flip-flop circuit or the like may be used as the holding section. However, the method of holding an amplitude level $D_{sc}$ by the use of capacitance (method of directly finding an intermediate level $D_{se}$ by devising a capacitance ratio) may be used as with a circuit illustrated in FIG. 13 (described later).

The intermediate level $D_{se}$ found by the data interpolation circuit 105 is inputted to the second comparison circuit 106. The second comparison circuit 106 compares the intermediate level $D_{se}$ inputted from the data interpolation circuit 105 with the determined threshold Th. If the intermediate level $D_{se}$ is higher than the determined threshold Th, then the second comparison circuit 106 outputs the bit value "1" as a comparison result $D_{de}$. If the intermediate level $D_{se}$ is lower than the determined threshold Th, then the second comparison circuit 106 outputs the bit value "0" as a comparison result $D_{de}$. The bit value $D_{de}$ indicative of a comparison result is inputted to the phase detection circuit 107.

The phase detection circuit 107 detects a phase deviation of the sampling clock on the basis of the bit value $D_{dc}$ inputted from the first comparison circuit 103 and the bit value $D_{de}$ inputted from the second comparison circuit 106. As indicated in FIG. 2, the phase detection circuit 107 decides a direction of the phase deviation from a combination of a bit value $D_{de}$ and two bit values $D_{dc}$ corresponding thereto, and outputs an UP/DN signal indicative of a decision result. In addition to a bit value $D_{de}$ and two bit values $D_{dc}$ corresponding thereto, the phase detection circuit 107 may take another bit value $D_{dc}$ or other bit values $D_{dc}$ into consideration to detect a phase deviation. Such a modification will be described later.

If the phase detection circuit 107 decides that a phase of the sampling clock is slow, then the phase detection circuit 107 outputs an UP/DN signal (+1) for setting forward the phase of the sampling clock. On the other hand, if the phase detection circuit 107 decides that a phase of the sampling clock is fast, then the phase detection circuit 107 outputs an UP/DN signal (−1) for setting back the phase of the sampling clock. In addition, if the phase detection circuit 107 does not detect a phase deviation of the sampling clock from a combination of a bit value $D_{de}$ and two bit values $D_{dc}$, then the phase detection circuit 107 outputs an UP/DN signal the value of which is set to "0" so as not to adjust a phase of the sampling clock.

The UP/DN signal outputted from the phase detection circuit 107 is inputted to the filter 108. The filter 108 outputs a phase code $Ph_{code}$ obtained by removing a high-frequency component of the UP/DN signal inputted from the phase detection circuit 107. The phase code $Ph_{code}$ is inputted to the phase adjustment circuit 109. A clock $CLK_{in}$ before phase adjustment is inputted from the clock input terminal 110 to the phase adjustment circuit 109. The phase adjustment circuit 109 adjusts a phase of the clock $CLK_{in}$ in accordance with the phase code $Ph_{code}$ and outputs a sampling clock $CLK_s$. The sampling clock $CLK_s$ after phase adjustment is inputted to the sampling circuit 102.

A phase of the sampling clock $CLK_s$ is adjusted in the above way. By doing so, data is detected from the input data signal $D_{in}$ at a proper timing and data detection accuracy improves. Furthermore, a phase deviation is detected with an intermediate level $D_{se}$ which approximates to an amplitude level at a zero-crossing point that is hardly influenced by variations in the amplitude of the input data signal $D_{in}$ as reference. Accordingly, deterioration in detection accuracy due to variations in the amplitude hardly occurs. Furthermore, with the receiver circuit 100, there is no need to use a special sampling circuit for detecting an amplitude level at a zero-crossing point. This checks an increase in circuit size.

The example of the receiver circuit 100 according to the second embodiment has been described. Examples and modifications of the comparison circuits and the phase detection circuit included in the receiver circuit 100 will now be described further.

(Examples of Comparison Circuits)

Figure 4:
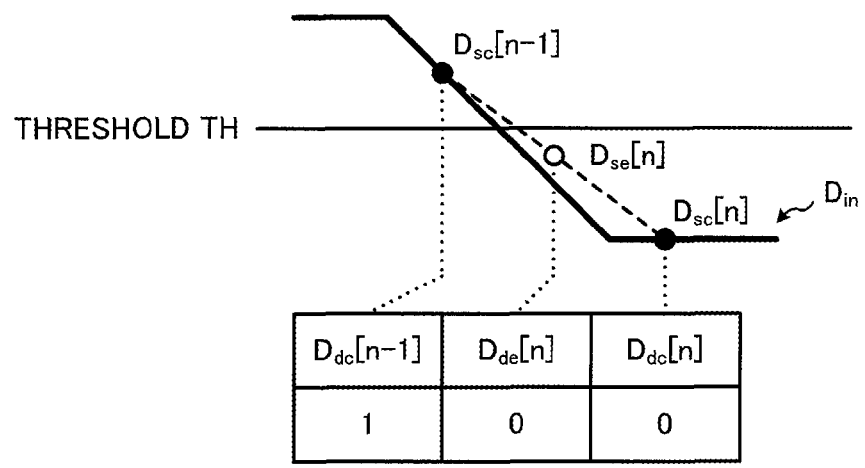
FIG. 4 is an example of a process performed by each comparison circuit in the second embodiment.

The contents of processes performed by the first comparison circuit 103 and the second comparison circuit 106 in the second embodiment will now be described with reference to FIG. 4. FIG. 4 is an example of a process performed by each comparison circuit in the second embodiment. The first comparison circuit 103 and the second comparison circuit 106 are comparators which perform comparison processes by the use of the same threshold Th.

In the example of FIG. 4, the first comparison circuit 103 compares amplitude levels $D_{sc}[n-1]$ and $D_{sc}[n]$ inputted in order with the threshold Th and outputs bit values indicative of comparison results. In the example, the amplitude level $D_{sc}[n-1]$ is higher than the threshold Th, so the first comparison circuit 103 outputs the bit value "1" as a comparison result $D_{dc}[n-1]$ on the amplitude level $D_{sc}[n-1]$. On the other hand, the amplitude level $D_{sc}[n]$ is lower than the threshold Th, so the first comparison circuit 103 outputs the bit value "0" as a comparison result $D_{dc}[n]$ on the amplitude level $D_{sc}[n]$.

The second comparison circuit 106 compares an intermediate level $D_{se}[n]$ with the threshold Th and outputs a bit value indicative of a comparison result. In the example of FIG. 4, the intermediate level $D_{se}[n]$ is lower than the threshold Th, so the second comparison circuit 106 outputs the bit value "0" as a comparison result $D_{de}[n]$ on the intermediate level $D_{se}[n]$. As has been described, the first comparison circuit 103 and the second comparison circuit 106 compare inputted amplitude levels $D_{sc}$ and an intermediate level $D_{se}$, respectively, with the threshold Th and output bit values indicative of comparison results.

The contents of the processes performed by the first comparison circuit 103 and the second comparison circuit 106 in the second embodiment have been described.

(Example of Phase Detection Circuit)

Figure 5:
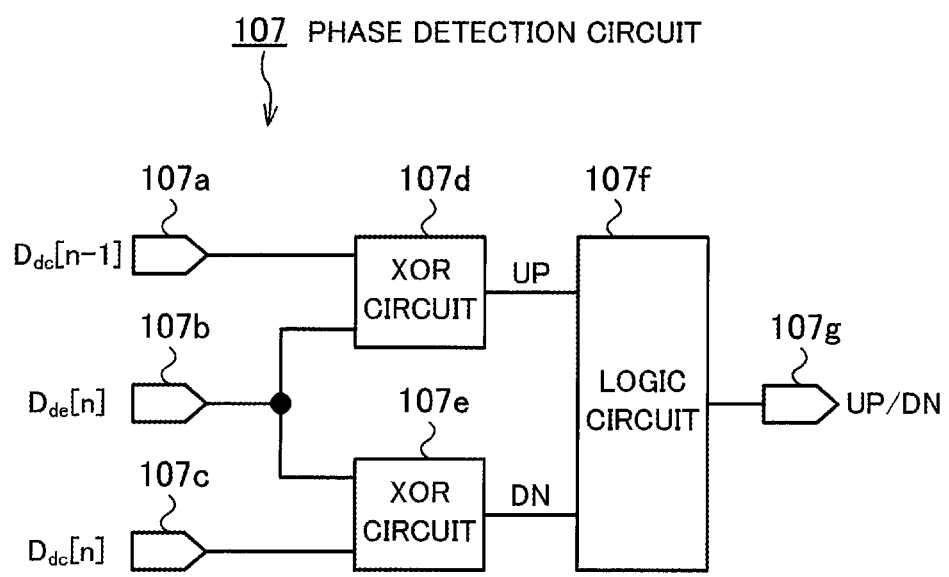
FIG. 5 is an example of a phase detection circuit in the second embodiment.

The phase detection circuit 107 in the second embodiment will now be described with reference to FIGS. 5 and 6. FIG. 5 is an example of the phase detection circuit in the second embodiment. FIG. 6 indicates the relationships among inputs to and an output from the phase detection circuit in the second embodiment.

As illustrated in FIG. 5, the phase detection circuit 107 includes XOR (exclusive disjunction) circuits 107d and 107e and a logic circuit 107f. One input of the XOR circuit 107d is connected to an input terminal 107a and the other input of the XOR circuit 107d is connected to an input terminal 107b. An output of the XOR circuit 107d is connected to an input of the logic circuit 107f. One input of the XOR circuit 107e is connected to the input terminal 107b and the other input of the XOR circuit 107e is connected to an input terminal 107c. An output of the XOR circuit 107e is connected to an input of the logic circuit 107f. An output of the logic circuit 107f is connected to an output terminal 107g.

It is assumed that amplitude levels $D_{dc}[n-1]$, $D_{de}[n]$, and $D_{dc}[n]$ are inputted to the input terminal 107a, 107b, and 107c respectively. Furthermore, an output from the XOR circuit 107d is indicated by "UP" and an output from the XOR circuit 107e is indicated by "DN". In this case, the relationships among $D_{dc}[n-1]$, $D_{de}[n]$, $D_{dc}[n]$, UP, and DN are given by a table indicated in FIG. 6.

As indicated in the table in FIG. 6, the logic circuit 107f outputs an UP/DN signal on the basis of a combination of UP and DN. For example, the logic circuit 107f holds in a look-up table the relationships among UP, DN, and an UP/DN signal indicated in FIG. 6, refers to the look-up table, and outputs a value of UP/DN according to inputted UP and DN. For example, if $D_{dc}[n-1]$ is "0", $D_{de}[n]$ is "0", and $D_{dc}[n]$ is "1", UP is "0" and DN is "1". As a result, the logic circuit 107f outputs an UP/DN signal (−1) corresponding to a case where (UP, DN) is (0, 1). The UP/DN signal (−1) indicates that a phase of a sampling clock is fast. Accordingly, an adjustment is made at a subsequent stage for setting back a phase of the sampling clock.

If $D_{dc}[n-1]$ is "0", $D_{de}[n]$ is "1", and $D_{dc}[n]$ is "1", UP is "1" and DN is "0". As a result, the logic circuit 107f outputs an UP/DN signal (+1) corresponding to a case where (UP, DN) is (1, 0). The UP/DN signal (+1) indicates that a phase of the sampling clock is slow. Accordingly, an adjustment is made at a subsequent stage for setting forward a phase of the sampling clock. Similarly, on the basis of logic indicated in the table in FIG. 6, an UP/DN signal indicative of a phase deviation of the sampling clock is outputted for the other combinations. An UP/DN signal the value of which is is outputted for a combination by which a phase deviation of the sampling clock is not be detected.

The phase detection circuit 107 in the second embodiment has been described.

((Modification) 4-Bit Pattern Filter)

A modification in the second embodiment will now be described with reference to FIG. 7. The method of detecting a phase deviation of the sampling clock by the use of two amplitude levels obtained by sampling the input data signal $D_{in}$ at two sampling timings and an intermediate level between the two amplitude levels has been described in the foregoing. In this modification the method of sampling an input data signal $D_{in}$ at four sampling timings and detecting a phase deviation of a sampling clock by the use of four amplitude levels and an intermediate level will be described. FIG. 7 is an example of a 4-bit pattern filter in the second embodiment.

For example, it is assumed that four bit values $D_{dc}[n-2]$, $D_{dc}[n-1]$, $D_{dc}[n]$, and $D_{dc}[n+1]$ corresponding to four amplitude levels $D_{sc}[n-2]$, $D_{sc}[n-1]$, $D_{sc}[n]$, and $D_{sc}[n+1]$ are obtained. In addition, it is assumed that a bit value $D_{de}[n]$ corresponding to an intermediate level $D_{se}[n]$ is obtained. In this case, the phase detection circuit 107 can detect a phase deviation of the sampling clock by the use of the three bit values $D_{dc}[n-1]$, $D_{de}[n]$, and $D_{dc}[n]$ on the basis of the above method.

A phase detection circuit 107 in the modification decides whether or not a pattern obtained by combining the four bit values $D_{dc}[n-2]$, $D_{dc}[n-1]$, $D_{dc}[n]$, and $D_{dc}[n+1]$ matches a determined filter pattern. If a pattern obtained by combining the four bit values $D_{dc}[n-2]$, $D_{dc}[n-1]$, $D_{dc}[n]$, and $D_{dc}[n+1]$ matches a determined filter pattern, then the phase detection circuit 107 outputs an UP/DN signal corresponding to a detected phase deviation. On the other hand, if a pattern obtained by combining the four bit values $D_{dc}[n-2]$, $D_{dc}[n-1]$, $D_{dc}[n]$, and $D_{dc}[n+1]$ does not match a determined filter pattern, then the phase detection circuit 107 outputs an UP/DN signal the value of which is "0".

In the example of FIG. 7, the patterns (0011) and (1100) are set as filter patterns. If a great loss occurs, the influence of inter-symbol interference increases and, therefore, the amplitude of a high-frequency component of the input data signal $D_{in}$ becomes small. With the patterns (0101), (1010), and the like, a slew rate is very low. That is to say, signal-to-noise ratio at a zero-crossing point deteriorates and phase deviation detection accuracy deteriorates. Accordingly, the exclusion of these patterns prevents phase deviation detection accuracy from deteriorating. In addition, the exclusion of the patterns (0010), (0100), and the like in which only one bit is "1" or "0" prevents phase deviation detection accuracy further from deteriorating. For example, the case of the pattern (0010) will be described. If a great loss occurs, an amplitude level corresponding to the third bit does not rise sufficiently and an intermediate level generated by interpolation may become low. By excluding this pattern, the probability that an erroneous phase is detected is decreased.

If the influence of transmission line loss, noise, and the like is slight and the input data signal $D_{in}$ in which loss is small is obtained, practical detection accuracy may be obtained even by the use of a smaller number of filter patterns. A decrease in the number of filter patterns increases a detection rate (detection opportunity) for a phase of the sampling clock. On the other hand, if a great loss occurs, many filter patterns for which a detection error tends to occur are set. By doing so, the probability that an erroneous phase is detected is decreased. Accordingly, a mechanism in which the phase detection circuit 107 switches a combination of filter patterns to be applied according to conditions may be adopted. In addition, a mechanism in which the phase detection circuit 107 performs switching between application and nonapplication of filter patterns according to conditions may be adopted.

For example, a mechanism in which a large number of filter patters are applied in the case of a slew rate of the input data signal $D_{in}$ being lower than a determined threshold and in which a small number of filter patters are applied in the other cases may be adopted. Furthermore, a mechanism in which a large number of filter patters are applied in the case of an interval between sampling timings corresponding to two threshold levels used for calculating an intermediate level being short and in which a small number of filter patters are applied in the other cases may be adopted. A mechanism in which a filter pattern is not applied instead of applying a small number of filter patters may be adopted.

The modification in the second embodiment has been described. By applying the above modification, the accuracy with which a phase deviation of the sampling clock is detected hardly deteriorates even if, for example, a great loss occurs. In the above description a method for setting a filter pattern by combining four bit values is indicated. However, if loss is small, a method for setting a filter pattern by combining three bit values may be applied.

The second embodiment has been described.

Third Embodiment

A third embodiment will now be described. In a third embodiment the method of replacing a comparison circuit which detects a bit value for data detection with a DFE (Decision Feedback Equalizer) is proposed. In addition, in a third embodiment a mechanism in which signal loss and a slew rate are estimated from an equalization coefficient of the DFE and in which a filter pattern is switched according to an estimation result is proposed.

(Example of Receiver Circuit)

Figure 8:
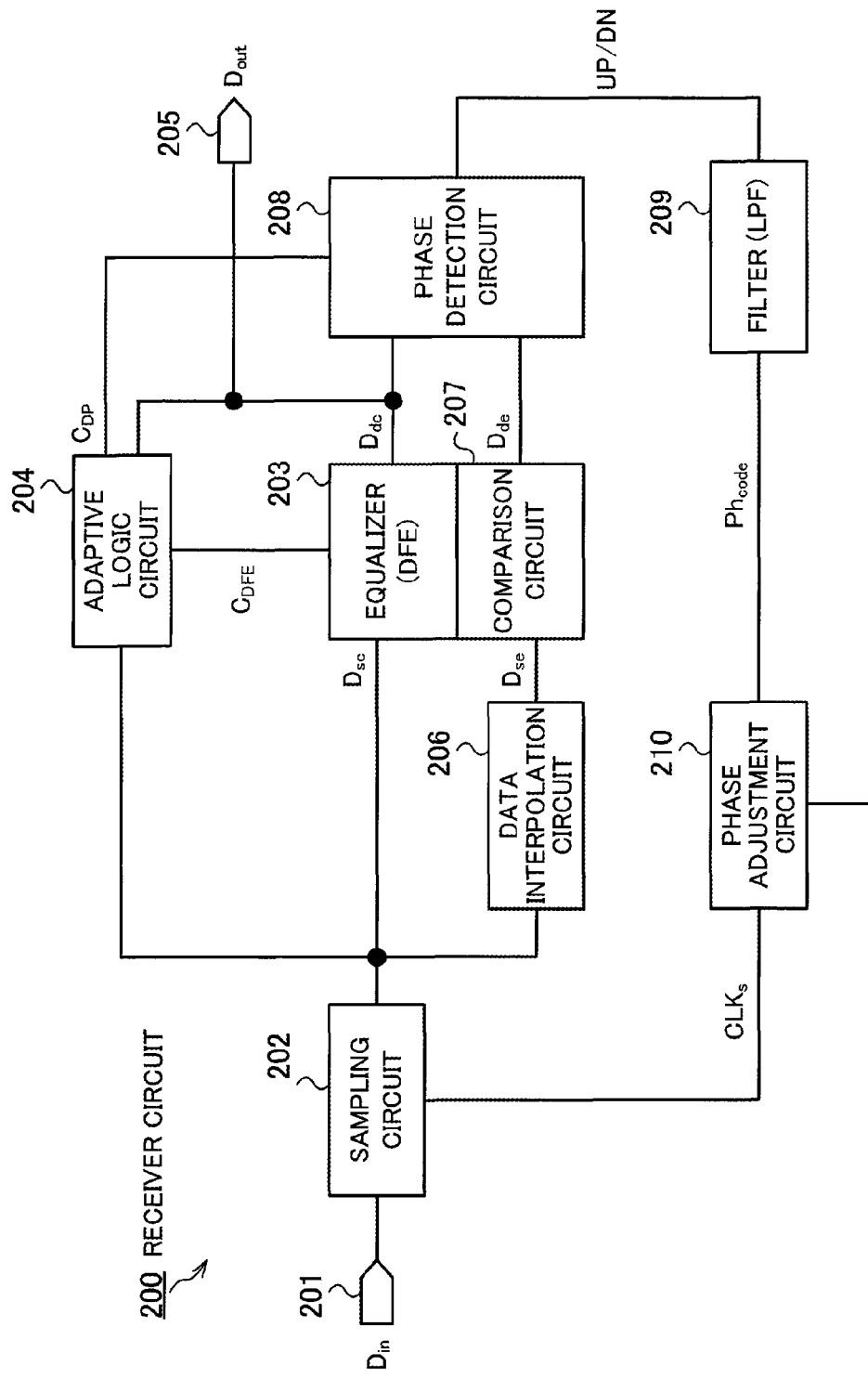
FIG. 8 is an example of a receiver circuit according to a third embodiment.

First an example of a receiver circuit 200 according to a third embodiment will be described with reference to FIG. 8. FIG. 8 is an example of a receiver circuit according to a third embodiment. There are components in a receiver circuit 200 which are substantially the same as those in the receiver circuit 100 according to the second embodiment. It may be that only the correspondences between these components in the receiver circuit 200 and the components in the receiver circuit 100 will be indicated and that detailed description of these components in the receiver circuit 200 will be omitted.

As illustrated in FIG. 8, the receiver circuit 200 includes a data input terminal 201, a sampling circuit 202, an equalizer 203, an adaptive logic circuit 204, and a data output terminal 205. In addition, the receiver circuit 200 includes a data interpolation circuit 206, a comparison circuit 207, a phase detection circuit 208, a filter 209, a phase adjustment circuit 210, and a clock input terminal 211.

The data input terminal 201, the sampling circuit 202, and the data output terminal 205 are substantially the same as the data input terminal 101, the sampling circuit 102, and the data output terminal 104, respectively, in the second embodiment. Furthermore, the data interpolation circuit 206, the comparison circuit 207, the filter 209, the phase adjustment circuit 210, and the clock input terminal 211 are substantially the same as the data interpolation circuit 105, the second comparison circuit 106, the filter 108, the phase adjustment circuit 109, and the clock input terminal 110, respectively, in the second embodiment. Accordingly, detailed description of these components will be omitted.

An input data signal $D_{in}$ is inputted to the data input terminal 201. The input data signal $D_{in}$ is inputted to the sampling circuit 202. The sampling circuit 202 detects an amplitude level $D_{sc}$ of the input data signal $D_{in}$ at a sampling timing indicated by a sampling clock $CLK_s$. The amplitude level $D_{sc}$ detected by the sampling circuit 202 is inputted to the equalizer 203, the adaptive logic circuit 204, and the data interpolation circuit 206.

The equalizer 203 removes inter-symbol interference between a bit decided in the past and a bit which is to be decided by feeding back a decided signal and performing weighting synthesis. In the example of FIG. 8, a decision feedback equalizer (DFE) is used as the equalizer 203. However, another adaptive linear equalizer or nonlinear equalizer (such as an MLSE (Maximum Likelihood Sequence Estimator)) may be used. The equalizer 203 performs an equalization process on the amplitude level $D_{sc}$ by the use of an equalization coefficient $C_{DFE}$ and outputs a bit value $D_{dc}$ indicative of a result obtained by comparing a signal after equalization and a determined threshold Th. A circuit and the operation of the equalizer 203 will be described later in detail.

The bit value $D_{dc}$ outputted from the equalizer 203 is outputted as received data $D_{out}$ from the data output terminal 205 to the outside of the receiver circuit 200. In addition, the bit value $D_{dc}$ is inputted to the adaptive logic circuit 204 and the phase detection circuit 208.

The adaptive logic circuit 204 exercises control so that the equalization coefficient $C_{DFE}$ (combination of equalization coefficients $w_1$, $w_2$, and so on described later) used by the equalizer 203 for performing an equalization process will be an optimum value. The equalization coefficient $C_{DFE}$ is calculated by the use of an optimization algorithm such as an LMS (Least Mean Square) algorithm or an RLS (Recursive Least Square) algorithm. Furthermore, the adaptive logic circuit 204 estimates loss in the amplitude level $D_{sc}$ or a slew rate from the value of the equalization coefficient $C_{DFE}$ and outputs a data pattern code $C_{DP}$ corresponding to the magnitude of the loss in the amplitude level $D_{sc}$ or the value of the slew rate. The data pattern code $C_{DP}$ is inputted to the phase detection circuit 208.

For example, the method of detecting the difference between an amplitude level $D_{sc}$ obtained in the case of bit values $D_{dc}$ being (1111111) and an amplitude level $D_{sc}$ corresponding to the bit value $D_{dc}$ "1" in the case of bit values $D_{dc}$ being (0001000) may be used as a loss estimation method. This difference is the difference between a low-frequency component and a high-frequency component of the input data signal $D_{in}$. As loss increases, this difference grows. Accordingly, by detecting this difference, loss can be estimated.

For example, the method of estimating a slew rate from an amplitude level $D_{sc}$ corresponding to each bit value $D_{dc}$ in the case of bit values $D_{dc}$ being (000111) may be used as a slew rate estimation method. For example, the following method may be used.

First the difference between amplitude levels $D_{sc}$ at bits one bit before and after a point at which a bit value $D_{dc}$ changes from "0" to "1", the difference between amplitude levels $D_{sc}$ at bits two bits before and after the point at which a bit value $D_{dc}$ changes from "0" to "1", and the difference between amplitude levels $D_{sc}$ at bits three bits before and after the point at which a bit value $D_{dc}$ changes from "0" to "1" are obtained. These amplitude level differentials increase for the two, four, and six bits and are divided by two, four, and six. Values obtained correspond to slew rates. When loss is small, amplitude is saturated. Accordingly, the same value is obtained as a result of these calculations. However, as loss increases, the following change takes place. First only the result obtained from the bits one bit before and after the point at which a bit value $D_{dc}$ changes from "0" to "1" differs from the other results and then the results obtained from the bits one bit before and after the point at which a bit value $D_{dc}$ changes from "0" to "1" and the bits two bits before and after the point at which a bit value $D_{dc}$ changes from "0" to "1" differ from the other result. The threshold of an increase in amplitude level for calculating a value corresponding to a slew rate is determined from the linearity of a circuit and the like and a final slew rate is calculated.

The data interpolation circuit 206 performs an interpolation process by the use of two amplitude levels $D_{sc}$ detected at two sampling timings to find an intermediate level $D_{se}$ which approximates to an amplitude level of the input data signal $D_{in}$ at a zero-crossing point. The intermediate level $D_{se}$ found by the data interpolation circuit 206 is inputted to the comparison circuit 207. The comparison circuit 207 compares the intermediate level $D_{se}$ inputted from the data interpolation circuit 206 with a determined threshold Th. If the intermediate level $D_{se}$ is higher than the determined threshold Th, then the comparison circuit 207 outputs the bit value "1" as a comparison result $D_{de}$. If the intermediate level $D_{se}$ is lower than the determined threshold Th, then the comparison circuit 207 outputs the bit value "0" as a comparison result $D_{de}$. The bit value $D_{de}$ indicative of a comparison result is inputted to the phase detection circuit 208.

The phase detection circuit 208 detects a phase deviation of a sampling clock on the basis of the bit value $D_{dc}$ inputted from the equalizer 203 and the bit value $D_{de}$ inputted from the comparison circuit 207, and outputs an UP/DN signal indicative of a detection result. At this time the phase detection circuit 208 outputs an UP/DN signal with a filter pattern taken into consideration. This is the same with the modification in the second embodiment. At this time the phase detection circuit 208 switches the contents of a filter pattern according to the data pattern code $C_{DP}$ inputted from the adaptive logic circuit 204. A method for switching a filter pattern will be described later in detail.

The UP/DN signal outputted from the phase detection circuit 208 is inputted to the filter 209. The filter 209 outputs a phase code $Ph_{code}$ obtained by removing a high-frequency component of the UP/DN signal inputted from the phase detection circuit 208. The phase code $Ph_{code}$ is inputted to the phase adjustment circuit 210. A clock $CLK_{in}$ before phase adjustment is inputted from the clock input terminal 211 to the phase adjustment circuit 210. The phase adjustment circuit 210 adjusts a phase of the clock $CLK_{in}$ in accordance with the phase code $Ph_{code}$ and outputs a sampling clock $CLK_s$. The sampling clock $CLK_s$ after phase adjustment is inputted to the sampling circuit 202.

The example of the receiver circuit 200 according to the third embodiment has been described. As stated above, the receiver circuit 200 according to the third embodiment differs from the receiver circuit 100 according to the second embodiment in the equalizer 203, the adaptive logic circuit 204, and the phase detection circuit 208. The equalizer 203, the adaptive logic circuit 204, and the phase detection circuit 208 will now be described further.

(Example of Equalizer (m-Tap DFE) and Equalization Factor Calculation Method)

Figure 9:
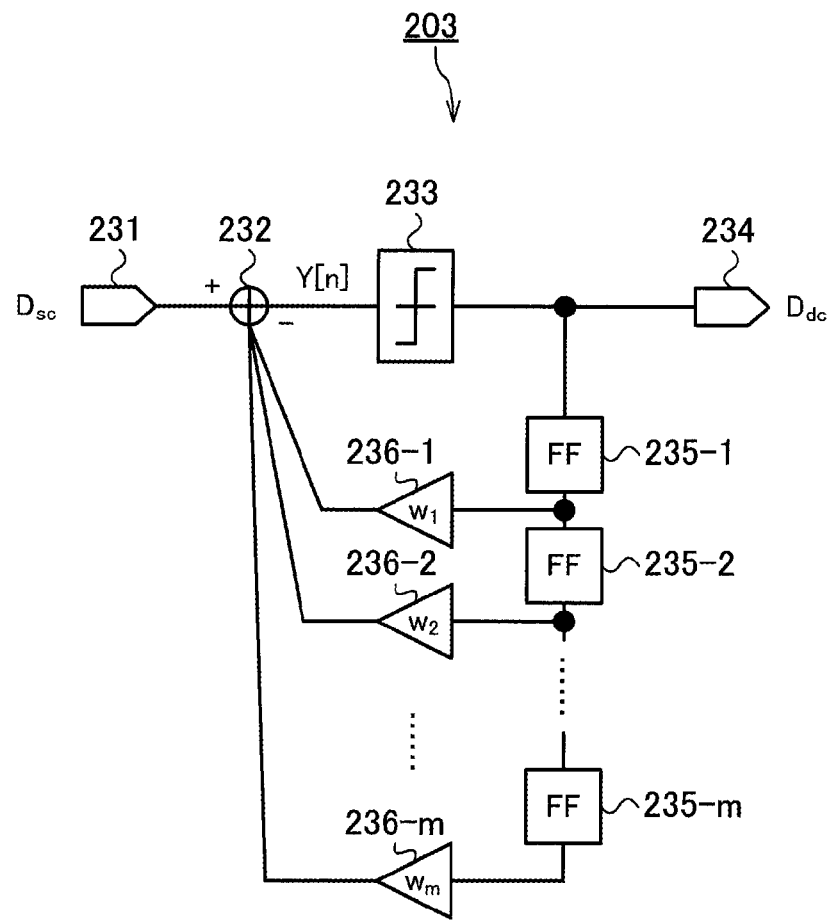
FIG. 9 is an example of an equalizer (m-tap DFE) in the third embodiment.

First an example of the equalizer 203 in which an m-tap DFE is used and an equalization coefficient calculation method will be described with reference to FIG. 9. FIG. 9 is an example of the equalizer (m-tap DFE) in the third embodiment.

In the example of FIG. 9, the equalizer 203 includes an adder and subtractor 232, a comparison circuit 233, a flip-flop circuit 235 (235-1 through 235-m), and a buffer circuit 236 (236-1 through 236-m). It is assumed that equalization coefficients $w_1, \ldots,$ and $w_m$ are given to the buffer circuits 236-1 through 236-m respectively. These equalization coefficients $w_1, \ldots,$ and $w_m$ are equalization coefficients $C_{DFE}$ supplied from the adaptive logic circuit 204. In addition, a threshold Th used by the comparison circuit 233 is the same as the threshold Th used by the comparison circuit 207.

An amplitude level $D_{sc}$ outputted from the sampling circuit 202 is inputted to an input terminal 231. The adder and subtractor 232 subtracts values outputted from the buffer circuits 236-1 through 236-m from the amplitude level $D_{sc}$ inputted via the input terminal 231, and outputs a signal Y. The signal Y is inputted to the comparison circuit 233. The comparison circuit 233 compares the signal Y and the threshold Th and outputs a bit value $D_{dc}$ indicative of a comparison result. The bit value $D_{dc}$ is outputted via an output terminal 234 and is inputted to the adaptive logic circuit 204, the data output terminal 205, and the phase detection circuit 208.

In addition, the bit value $D_{dc}$ is inputted to the flip-flop circuit 235-1. The flip-flop circuit 235-1 holds the bit value $D_{dc}$ only for one interval until the next bit value is inputted. After that, the flip-flop circuit 235-1 outputs the bit value $D_{dc}$. The bit value $D_{dc}$ outputted from the flip-flop circuit 235-1 is inputted to the buffer circuit 236-1 and the flip-flop circuit 235-2. The buffer circuit 236-1 multiplies the bit value $D_{dc}$ and the equalization coefficient $w_1$ together and inputs a value obtained by the multiplication to the adder and subtractor 232. The flip-flop circuits 235-2 through 235-m operate the same as the flip-flop circuit 235-1. The buffer circuits 236-2 through 236-m use the corresponding equalization coefficients $w_2$ through $w_m$, respectively, and operate the same as the buffer circuit 236-1.

For example, it is assumed that an amplitude level $D_{sc}[n]$ sampled in interval n (n>m) is inputted to the input terminal 231. In this case, the buffer circuit 236-1 multiplies a bit value $D_{dc}[n-1]$ held by the flip-flop circuit 235-1 and the equalization coefficient $w_1$ together and inputs a value $w_1*D_{dc}[n-1]$ to the adder and subtractor 232. Similarly, $w_2*D_{dc}[n-2], \ldots,$ and $w_m*D_{dc}[n-m]$ are inputted to the adder and subtractor 232. Accordingly, a signal Y[n] outputted from the adder and subtractor 232 is given by $$Y[n] = D_{sc}[n] - w_1 D_{dc}[n-1] - w_2 D_{dc}[n-2] - \ldots - w_m D_{dc}[n-m] \quad (1)$$

The comparison circuit 233 compares the signal Y[n] and the threshold Th and outputs a bit value $D_{dc}[n]$ indicative of a comparison result. The bit value $D_{dc}[n]$ is outputted from the output terminal 234 and is held by the flip-flop circuit 235-1. Furthermore, the flip-flop circuits 235-2 through 235-m hold bit values $D_{dc}[n-1]$ through $D_{dc}[n-m-1]$ respectively. The bit value $D_{dc}[n]$ outputted from the output terminal 234 is inputted to the adaptive logic circuit 204 and is used for updating the equalization coefficients $w_1$ through $w_m$. If the LMS algorithm, for example, is applied, the equalization coefficients $w_1$ through $w_m$ are updated in accordance with:

$$w_1[n] = w_1[n-1] - q\{Y[n] - D_{dc}[n]\}D_{dc}[n-1] \quad (2)$$
$$w_2[n] = w_2[n-1] - q\{Y[n] - D_{dc}[n]\}D_{dc}[n-2]$$
$$\ldots$$
$$w_m[n] = w_m[n-1] - q\{Y[n] - D_{dc}[n]\}D_{dc}[n-m]$$

where q is a step size parameter. A step size q is set to, for example, about 0.01 to 0.001. In accordance with expression (2), the adaptive logic circuit 204 uses the bit value $D_{dc}[n]$ inputted from the equalizer 203 for sequentially updating the equalization coefficients $w_1$ through $w_m$. The adaptive logic circuit 204 then supplies the equalization coefficients $w_1$ through $w_m$ after the update to the equalizer 203 as an equalization coefficient $C_{DFE}$. By repeating such an update, the equalization coefficients $w_1$ through $w_m$ converge at optimum values.

The example of the equalizer 203 in which an m-tap DFE is used and the equalization coefficient calculation method have been described.

(Example of Equalizer (1-Tap Speculative DFE))

Figure 10:
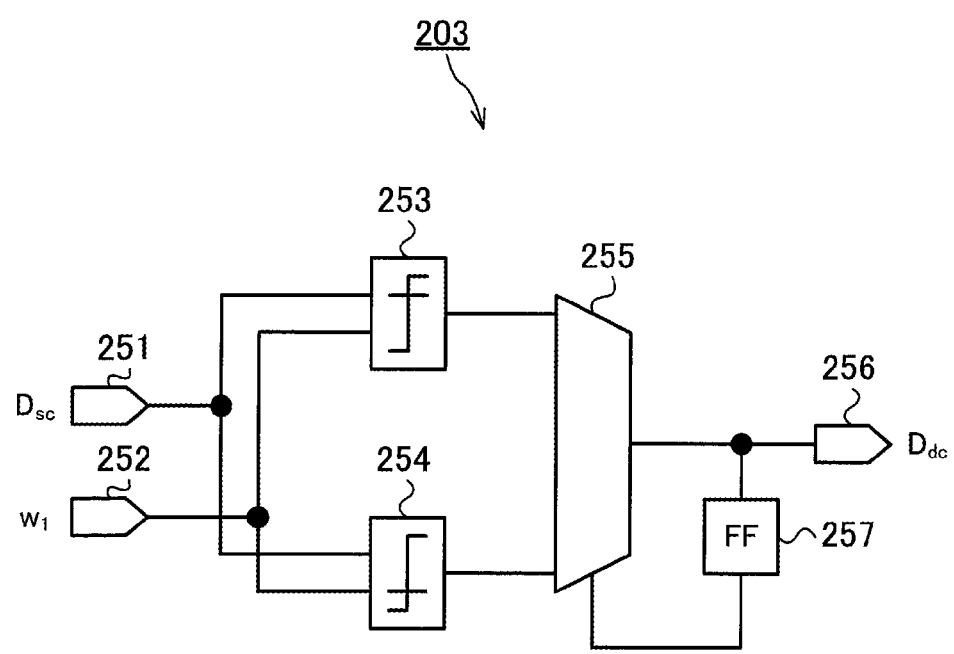
FIG. 10 is an example of an equalizer (1-tap Speculative DFE) in the third embodiment.

An example of the equalizer 203 in which a 1-tap speculative DFE is used will now be described with reference to FIG. 10. FIG. 10 is an example of the equalizer (1-tap speculative DFE) in the third embodiment. A speculative DFE acquires both the past data "0" and the past data "1" as decided data, and selects, after the settlement of the past data, a correct value on the basis of the past data. Accordingly, a speculative DFE can perform high-speed operation.

In the example of FIG. 10, an equalizer 203 includes comparison circuits 253 and 254, a selector 255, and a flip-flop circuit 257. An equalization coefficient $w_1$ is inputted from an input terminal 252 to the comparison circuits 253 and 254. The comparison circuit 253 compares a threshold $Th_1$ obtained by shifting a threshold Th by $+w_1$ and an amplitude level $D_{sc}$ inputted from an input terminal 251. On the other hand, the comparison circuit 254 compares a threshold $Th_2$ obtained by shifting the threshold Th by $-w_1$ and the amplitude level $D_{sc}$ inputted from the input terminal 251. A bit value $D_{dc1}$ indicative of a result of the comparison made by the comparison circuit 253 and a bit value $D_{dc2}$ indicative of a result of the comparison made by the comparison circuit 254 are inputted to the selector 255.

If a bit value $D_{dc}$ corresponding to an amplitude level $D_{sc}$ obtained at the preceding sampling timing is "1", then the selector 255 selects the bit value $D_{dc1}$. On the other hand, if a bit value $D_{dc}$ corresponding to an amplitude level $D_{sc}$ obtained at the preceding sampling timing is "0", then the selector 255 selects the bit value $D_{dc2}$. The selector 255 then outputs a selected bit value as a bit value $D_{dc}$ indicative of a decision result. The bit value $D_{dc}$ outputted from the selector 255 is outputted from an output terminal 256 and is held by the flip-flop circuit 257. The bit value $D_{dc}$ held by the flip-flop circuit 257 is used when the selector 255 selects a bit value at the next timing.

For example, if an amplitude level $D_{sc}[n]$ is inputted via the input terminal 251, a bit value $D_{dc1}[n]$ is outputted from the comparison circuit 253 and a bit value $D_{dc2}[n]$ is outputted from the comparison circuit 254. These bit values $D_{dc1}[n]$ and $D_{dc2}[n]$ are inputted to the selector 255. In addition, a bit value $D_{dc}[n-1]$ held by the flip-flop circuit 257 is inputted to the selector 255.

If the bit value $D_{dc}[n-1]$ is "1", then the selector 255 outputs the bit value $D_{dc1}[n]$ as a bit value $D_{dc}[n]$. On the other hand, if the bit value $D_{dc}[n-1]$ is "0", then the selector 255 outputs the bit value $D_{dc2}[n]$ as a bit value $D_{dc}[n]$. The bit value $D_{dc}[n]$ outputted from the selector 255 is outputted from the output terminal 256 and is held by the flip-flop circuit 257. The bit value $D_{dc}[n]$ outputted from the output terminal 256 is outputted from the data output terminal 205 to the outside and is inputted to the adaptive logic circuit 204 and the phase detection circuit 208. The adaptive logic circuit 204 updates the equalization coefficient $w_1$ on the basis of the inputted bit value $D_{dc}[n]$. An update method is the same with the m-tap DFE.

The example of the equalizer 203 in which a 1-tap speculative DFE is used has been described.

(Data Pattern Code $C_{DP}$)

A supplementary explanation of the data pattern code $C_{DP}$ will now be given.

As stated above, the adaptive logic circuit 204 updates every bit the equalization coefficients $w_1$ through $w_m$ used by the equalizer 203 for performing an equalization process. If there is a great loss in an amplitude level $D_{sc}$, the values of the equalization coefficients $w_1$ through $w_m$ will be high. Furthermore, if a slew rate indicative of the slope of a rising or falling edge of an input data signal $D_{in}$ is high, the values of the equalization coefficients $w_1$ through $w_m$ will be high. Accordingly, the adaptive logic circuit 204 generates the data pattern code $C_{DP}$ indicative of the magnitude of loss in amplitude level $D_{sc}$ or the value of a slew rate on the basis of the values of the equalization coefficients $w_1$ through $w_m$.

For example, the adaptive logic circuit 204 considers a value obtained by simply adding together the equalization coefficients $w_1$ through $w_m$ as the data pattern code $C_{DP}$. The adaptive logic circuit 204 may consider the sum of the absolute values of the equalization coefficients $w_1$ through $w_m$ ($|w_1| + \ldots + |w_m|$) as the data pattern code $C_{DP}$. Furthermore, the adaptive logic circuit 204 may consider the sum of the squares of the equalization coefficients $w_1$ through $w_m$ ($w_1^2 + \ldots + w_m^2$) as the data pattern code $C_{DP}$. The data pattern code $C_{DP}$ generated in this way is inputted to the phase detection circuit 208 and is used for filter pattern switching.

The supplementary explanation of the data pattern code $C_{DP}$, has been given.

(Filter Pattern Switching)

Figure 11:
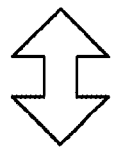
FIG. 11 indicates a filter pattern switching method in the third embodiment.

A filter pattern switching method in the third embodiment will now be described with reference to FIG. 11. FIG. 11 indicates a filter pattern switching method in the third embodiment.

As stated above, the phase detection circuit 208 uses four amplitude levels and an intermediate level for detecting a phase deviation of a sampling clock. At this time the phase detection circuit 208 decides whether or not a combination of the four amplitude levels matches a filter pattern. If a combination of the four amplitude levels matches a filter pattern, then the phase detection circuit 208 outputs an UP/DN signal the value of which is "0". That is to say, if a combination of the four amplitude levels matches a filter pattern, the phase detection circuit 208 does not adjust a phase of the sampling clock. By excluding in this way a pattern by which phase detection accuracy deteriorates, the probability that an erroneous phase is detected is decreased and the risk of changing a phase of the sampling clock in an erroneous direction is reduced. As a result, received data detection accuracy improves.

However, sufficient phase detection accuracy may be obtained even if no filter pattern is applied or even if the number of filter patterns to be applied is reduced. This applies to, for example, a case where loss in amplitude level $D_{sc}$ is smaller than a determined threshold. In such a case, the number of opportunities to apply a filter pattern is reduced. As a result, the number of opportunities to detect a phase deviation of the sampling clock increases, and it is expected that great phase tracking ability is obtained. Accordingly, the phase detection circuit 208 performs filter pattern switching on the basis of the data pattern code $C_{DP}$ inputted from the adaptive logic circuit 204. For example, the phase detection circuit 208 may perform switching on the basis of the data pattern code $C_{DP}$ between filter patterns included in table (A) of FIG. 11 and filter patterns included in table (B) of FIG. 11.

The filter patterns included in table (A) are applied if loss indicated by the data pattern code $C_{DP}$ is smaller than a determined threshold. "*" in table (A) means "0" and "1". That is to say, if a filter pattern included in table (A) is applied, filtering is performed by the use of three bit values except a bit value corresponding to "*". On the other hand, a filter pattern included in table (B) is applied if loss indicated by the data pattern code $C_{DP}$ is greater than the determined threshold. The filter patterns included in table (B) are the same as those indicated in FIG. 7.

If there is a great loss in amplitude level $D_{sc}$, not only the patterns (0101) and (1010), by which erroneous phase detection tends to occur, but also the patterns (0010), (0100), (1101), and (1011) are applied for performing filtering. This reduces the probability of erroneous detection. On the other hand, if loss in amplitude level $D_{sc}$ is smaller than the determined threshold, the pattern (0010), (0100), (1101), or (1011) is not applied at filtering time. As a result, the number of opportunities to detect a phase deviation increases and phase tracking ability increases. Filter pattern switching is performed on the basis of the data pattern code $C_{DP}$. Accordingly, even if a slew rate is higher than a determined threshold, filter pattern switching is also performed. For example, the magnitude of loss is determined in the following way. The data pattern code $C_{DP}$ and a determined value are compared. If the data pattern code $C_{DP}$ is greater than the determined value, then the determination that a great loss has occurred is made. If the data pattern code $C_{DP}$ is smaller than the determined value, then the determination that a small loss has occurred is made.

The filter pattern switching method in the third embodiment has been described. The following mechanism may be adopted as a modification. If loss is smaller than a determined threshold, switching is performed so that no filter pattern will be applied. Furthermore, the following mechanism may be adopted as a modification. Staged filter pattern switching is performed according to the magnitude of loss in the order of application of a filter pattern included in table (B), a filter pattern included in table (A), and no filter pattern. These modifications also fall within the technical scope of the third embodiment.

The third embodiment has been described.

Fourth Embodiment

A fourth embodiment will now be described. In a fourth embodiment the following mechanism is proposed. A part of the receiver circuit according to the second or third embodiment is provided in plurality and parallel connections are made. By doing so, data processing is performed on a plurality of bits in parallel. In this mechanism a group of circuits connected in parallel operate intermittently (interleaved operation) in a cycle which is longer than a cycle of a clock $CLK_{in}$ inputted for sampling. This makes it possible to reduce the operating speeds of individual circuits. As a result, it is easy to make a receiver circuit operate at a high data rate.

(Example 1 of Receiver Circuit)

Figure 12:
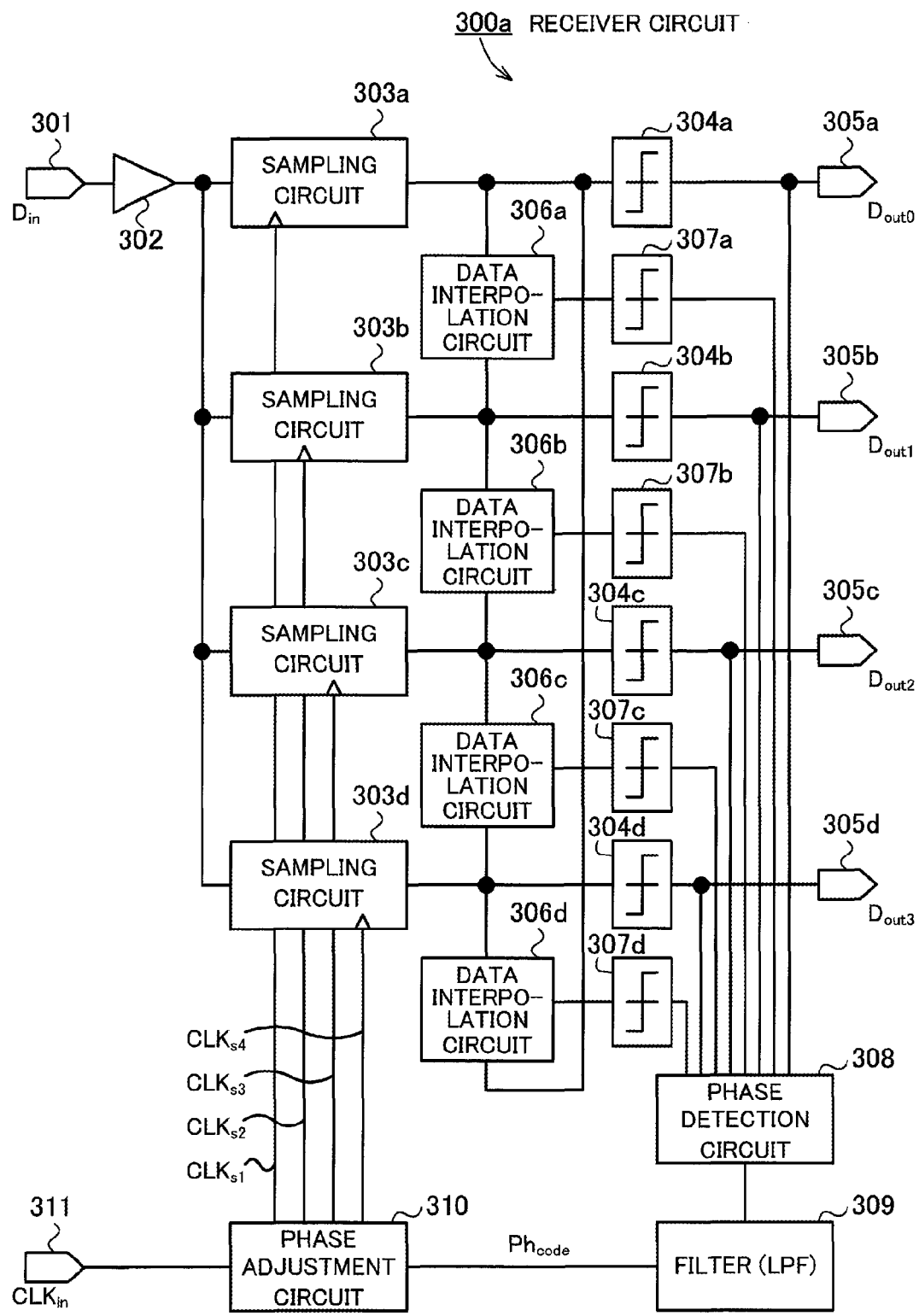
FIG. 12 is a first example of a receiver circuit according to a fourth embodiment.

First a receiver circuit 300a according to the fourth embodiment will be described with reference to FIG. 12. FIG. 12 is a first example of a receiver circuit according to the fourth embodiment. There are components in a receiver circuit 300a which have substantially the same functions as the components in the receiver circuit 100 according to the second embodiment have. It may be that only the correspondences between these components in the receiver circuit 300a and the components in the receiver circuit 100 will be indicated and that detailed description of these components in the receiver circuit 300a will be omitted.

As illustrated in FIG. 12, the receiver circuit 300a includes a data input terminal 301, an amplifier 302, sampling circuits 303a through 303d, first comparison circuits 304a through 304d, and data output terminals 305a through 305d. In addition, the receiver circuit 300a includes data interpolation circuits 306a through 306d, second comparison circuits 307a through 307d, a phase detection circuit 308, a filter 309, a phase adjustment circuit 310, and a clock input terminal 311.

The data input terminal 301, the sampling circuits 303a through 303d, the first comparison circuits 304a through 304d, and the data output terminals 305a through 305d correspond to the data input terminal 101, the sampling circuit 102, the first comparison circuit 103, and the data output terminal 104 respectively. In addition, the data interpolation circuits 306a through 306d, the second comparison circuits 307a through 307d, the phase detection circuit 308, the filter 309, the phase adjustment circuit 310, and the clock input terminal 311 correspond to the data interpolation circuit 105, the second comparison circuit 106, the phase detection circuit 107, the filter 108, the phase adjustment circuit 109, and the clock input terminal 110 respectively.

The receiver circuit 300a according to the fourth embodiment mainly differs from the receiver circuit 100 according to the second embodiment in timing at which the sampling circuits 303a through 303d perform sampling and timing at which each circuit operates according to the timing. Accordingly, description will be given with attention paid to the operation of the sampling circuits 303a through 303d and the data interpolation circuits 306a through 306d. In the example of FIG. 12, the receiver circuit 300a according to the fourth embodiment also differs from the receiver circuit 100 according to the second embodiment in that an input data signal $D_{in}$ is amplified by the amplifier 302.

For example, the sampling circuit 303a outputs amplitude levels $D_{sc}[n]$, $D_{sc}[n+4]$, and so on by sampling. The sampling circuit 303b outputs amplitude levels $D_{sc}[n+1]$, $D_{sc}[n+5]$, and so on by sampling. The sampling circuit 303c outputs amplitude levels $D_{sc}[n+2]$, $D_{sc}[n+6]$, and so on by sampling. The sampling circuit 303d outputs amplitude levels $D_{sc}[n+3]$, $D_{sc}[n+7]$, and so on by sampling.

Accordingly, the sampling circuits 303a through 303d operate in a sampling cycle four times the sampling cycle of the sampling circuit 102 in the second embodiment. Furthermore, the data interpolation circuits 306a through 306d operate on the basis of data outputted from the sampling circuits 303a through 303d respectively, so the data interpolation circuits 306a through 306d operate at an operating speed one fourth of an operating speed of the data interpolation circuit 105 in the second embodiment. The same applies to the first comparison circuits 304a through 304d and the second comparison circuits 307a through 307d. However, the operation of the phase detection circuit 308 and the filter 309 is the same as that of the phase detection circuit 107 and the filter 108, respectively, in the second embodiment.

In order to realize the above operation, the phase adjustment circuit 310 generates four sampling clocks $CLK_{s1}$ through $CLK_{s4}$ which differ in phase from the clock $CLK_{in}$ inputted, and supplies the four sampling clocks $CLK_{s1}$ through $CLK_{s4}$ to the sampling circuits 303a through 303d respectively. It is assumed that the wavelength of the clock $CLK_{in}$ is λ. Then the wavelengths of the sampling clocks $CLK_{s1}$ through $CLK_{s4}$ are 4λ and their phases differ by λ/2 from one another. For example, the phase adjustment circuit 310 adjusts a phase of the clock $CLK_{in}$ on the basis of a phase code $Ph_{code}$, generates the sampling clocks $CLK_{s1}$ through $CLK_{s4}$ from the clock $CLK_{in}$ after the adjustment, and supplies the sampling clocks $CLK_{s1}$ through $CLK_{s4}$ to the sampling circuits 303a through 303d respectively.

The receiver circuit 300a according to the fourth embodiment has been described. With the receiver circuit 300a a group of circuits connected in parallel perform interleaved operation. Accordingly, the operating speeds of individual circuits can be reduced and it is easy to make the receiver circuit 300a operate at a high data rate. Examples of the sampling circuits 303a through 303d and the data interpolation circuits 306a through 306d will now be described further.

(Sampling Circuits and Data Interpolation Circuits)

Figure 13:
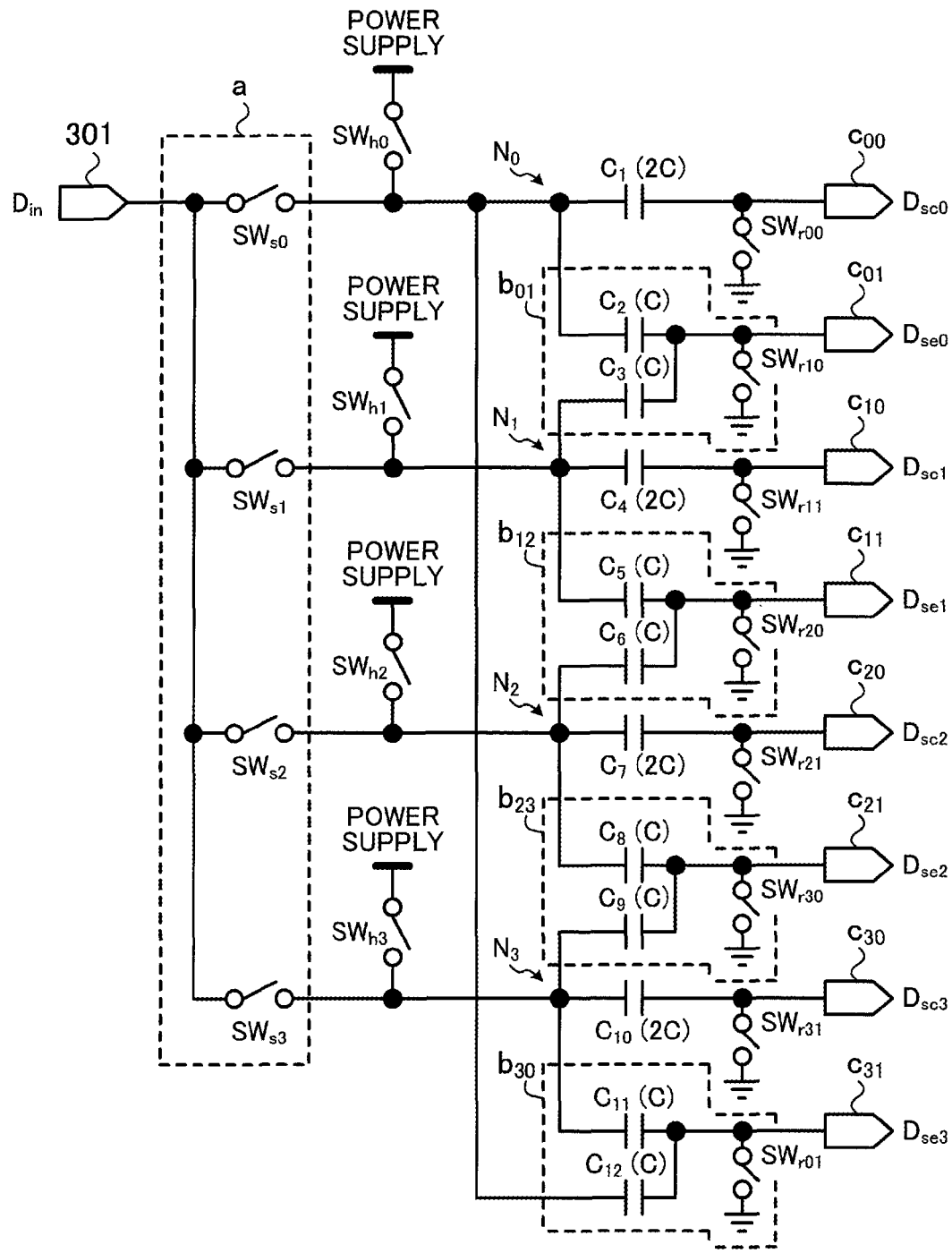
FIG. 13 illustrates examples of sampling circuits and data interpolation circuits in the fourth embodiment.

Examples of the sampling circuits 303a through 303d and the data interpolation circuits 306a through 306d in the fourth embodiment will now be described with reference to FIGS. 13 through 15. FIG. 13 illustrates examples of the sampling circuits and the data interpolation circuits in the fourth embodiment.

A circuit illustrated in FIG. 13 is realized by combining the sampling circuits 303a through 303d and the data interpolation circuits 306a through 306d. Combining the sampling circuits 303a through 303d and the data interpolation circuits 306a through 306d in the way illustrated in FIG. 13 makes the area of the circuit small. A portion in FIG. 13 which is marked with the letter "a" and which is enclosed by a dashed line corresponds to the sampling circuits 303a through 303d. In addition, portions which are marked with the numerals $b_{01}$, $b_{12}$, $b_{23}$, and $b_{30}$ and which are enclosed by dashed lines correspond to holding sections in the data interpolation circuits 306a through 306d for holding an amplitude level $D_{sc}$ and main sections of circuits in the data interpolation circuits 306a through 306d for finding an intermediate level $D_{se}$.

The circuit illustrated in FIG. 13 includes switches $SW_{s0}$, $SW_{s1}$, $SW_{s2}$, $SW_{s3}$, $SW_{h0}$, $SW_{h1}$, $SW_{h2}$, $SW_{h3}$, $SW_{r00}$, $SW_{r10}$, $SW_{r11}$, $SW_{r20}$, $SW_{r21}$, $SW_{r30}$, $SW_{r31}$, and $SW_{r01}$ and capacitances $C_1$ through $C_{12}$. The switches $SW_{s0}$, $SW_{s1}$, $SW_{s2}$, and $SW_{s3}$ are sampling switches. The switches $SW_{h0}$, $SW_{h1}$, $SW_{h2}$, and $SW_{h3}$ are holding switches. The switches $SW_{r00}$, $SW_{r01}$, $SW_{r10}$, $SW_{r11}$, $SW_{r20}$, $SW_{r21}$, $SW_{r30}$, and $SW_{r31}$ are resetting switches. The switch $SW_{r00}$ is interlocked with the switch $SW_{r01}$. The switch $SW_{r10}$ is interlocked with the switch $SW_{r11}$. The switch $SW_{r20}$ is interlocked with the switch $SW_{r21}$. The switch $SW_{r30}$ is interlocked with the switch $SW_{r31}$. In the following description the switches $SW_{r00}$ and $SW_{r01}$, the switches $SW_{r10}$ and $SW_{r11}$, the switches $SW_{r20}$ and $SW_{r21}$, and the switches $SW_{r30}$ and $SW_{r31}$ may be represented in block as switches $SW_{r0}$, $SW_{r1}$, $SW_{r2}$, and $SW_{r3}$ respectively.

The values of the capacitances $C_1$, $C_4$, $C_7$, and $C_{10}$ are set to 2C (C is a determined value) and the values of the capacitances $C_2$, $C_3$, $C_5$, $C_6$, $C_8$, $C_9$, $C_{11}$, and $C_{12}$ are set to C. That is to say, the values of the capacitances $C_1$, $C_4$, $C_7$, and $C_{10}$ are twice the values of the capacitances $C_2$, $C_3$, $C_5$, $C_6$, $C_8$, $C_9$, $C_{11}$, and $C_{12}$.

One end of each of the switches $SW_{s0}$, $SW_{s1}$, $SW_{s2}$, and $SW_{s3}$ is connected to a data input terminal 301. The other end of the switch $SW_{s0}$ is connected to a node $N_0$. The other end of the switch $SW_{s1}$ is connected to a node $N_1$. The other end of the switch $SW_{s2}$ is connected to a node $N_2$. The other end of the switch $SW_{s3}$ is connected to a node $N_3$. Furthermore, one end of each of the switches $SW_{h0}$, $SW_{h1}$, $SW_{h2}$, and $SW_{h3}$ is connected to power supply which supplies determined voltage. The other end of the switch $SW_{h0}$ is connected to the node $N_0$. The other end of the switch $SW_{h1}$ is connected to the node $N_1$. The other end of the switch $SW_{h2}$ is connected to the node $N_2$. The other end of the switch $SW_{h3}$ is connected to the node $N_3$. In addition, one end of each of the switches $SW_{r00}$, $SW_{r10}$, $SW_{r11}$, $SW_{r20}$, $SW_{r21}$, $SW_{r30}$, $SW_{r31}$, and $SW_{r01}$ is grounded. The other end of the switch $SW_{r00}$ is connected to an output terminal $c_{00}$. The other end of the switch $SW_{r10}$ is connected to an output terminal $c_{01}$. The other end of the switch $SW_{r11}$ is connected to an output terminal $c_{10}$. The other end of the switch $SW_{r20}$ is connected to an output terminal $c_{11}$. The other end of the switch $SW_{r21}$ is connected to an output terminal $c_{20}$. The other end of the switch $SW_{r30}$ is connected to an output terminal $c_{21}$. The other end of the switch $SW_{r31}$ is connected to an output terminal $c_{30}$. The other end of the switch $SW_{r01}$ is connected to an output terminal $c_{31}$.

One end of the capacitance $C_1$ is connected to the node $N_0$. One end of the capacitance $C_4$ is connected to the node $N_1$. One end of the capacitance $C_7$ is connected to the node $N_2$. One end of the capacitance $C_{10}$ is connected to the node $N_3$. The other end of the capacitance $C_1$ is connected to the output terminal $c_{00}$. The other end of the capacitance $C_4$ is connected to the output terminal $c_{10}$. The other end of the capacitance $C_7$ is connected to the output terminal $c_{20}$. The other end of the capacitance $C_{10}$ is connected to the output terminal $c_{30}$. Furthermore, one end of the capacitance $C_2$ is connected to the node $N_0$. One end of the capacitance $C_5$ is connected to the node $N_1$. One end of the capacitance $C_8$ is connected to the node $N_2$. One end of the capacitance $C_{11}$ is connected to the node $N_3$. The other end of the capacitance $C_2$ is connected to the output terminal $c_{01}$. The other end of the capacitance $C_5$ is connected to the output terminal $c_{11}$. The other end of the capacitance $C_8$ is connected to the output terminal $c_{21}$. The other end of the capacitance $C_{11}$ is connected to the output terminal $c_{31}$. In addition, one end of the capacitance $C_3$ is connected to the node $N_1$. One end of the capacitance $C_6$ is connected to the node $N_2$. One end of the capacitance $C_9$ is connected to the node $N_3$. One end of the capacitance $C_{12}$ is connected to the node $N_0$. The other end of the capacitance $C_3$ is connected to the output terminal $c_{01}$. The other end of the capacitance $C_6$ is connected to the output terminal $c_{11}$. The other end of the capacitance $C_9$ is connected to the output terminal $c_{21}$. The other end of the capacitance $C_{12}$ is connected to the output terminal $c_{31}$.

The operation of each switch, a change in potential at the nodes $N_0$ through $N_3$, and the waveform (amplitude level) of a signal outputted from each output terminal will now be described with reference to not only FIG. 13 but also FIGS. 14 and 15. FIG. 14 indicates operation timing of each switch included in the sampling circuits and the data interpolation circuits in the fourth embodiment. FIG. 15 indicates a change in node potential and a change in outputted amplitude level in the sampling circuits and the data interpolation circuits in the fourth embodiment.

Figure 14:
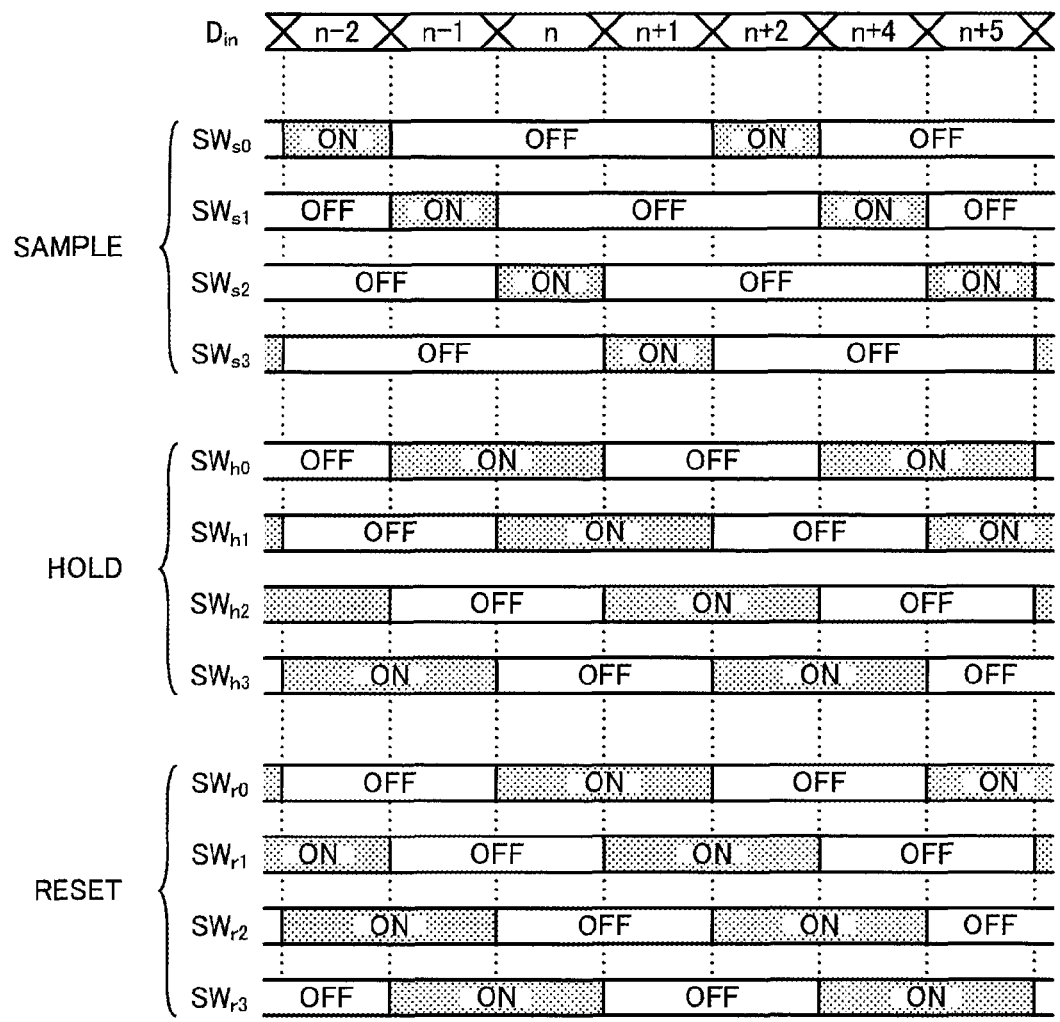
FIG. 14 indicates operation timing of each switch included in the sampling circuits and the data interpolation circuits in the fourth embodiment.
Figure 15:
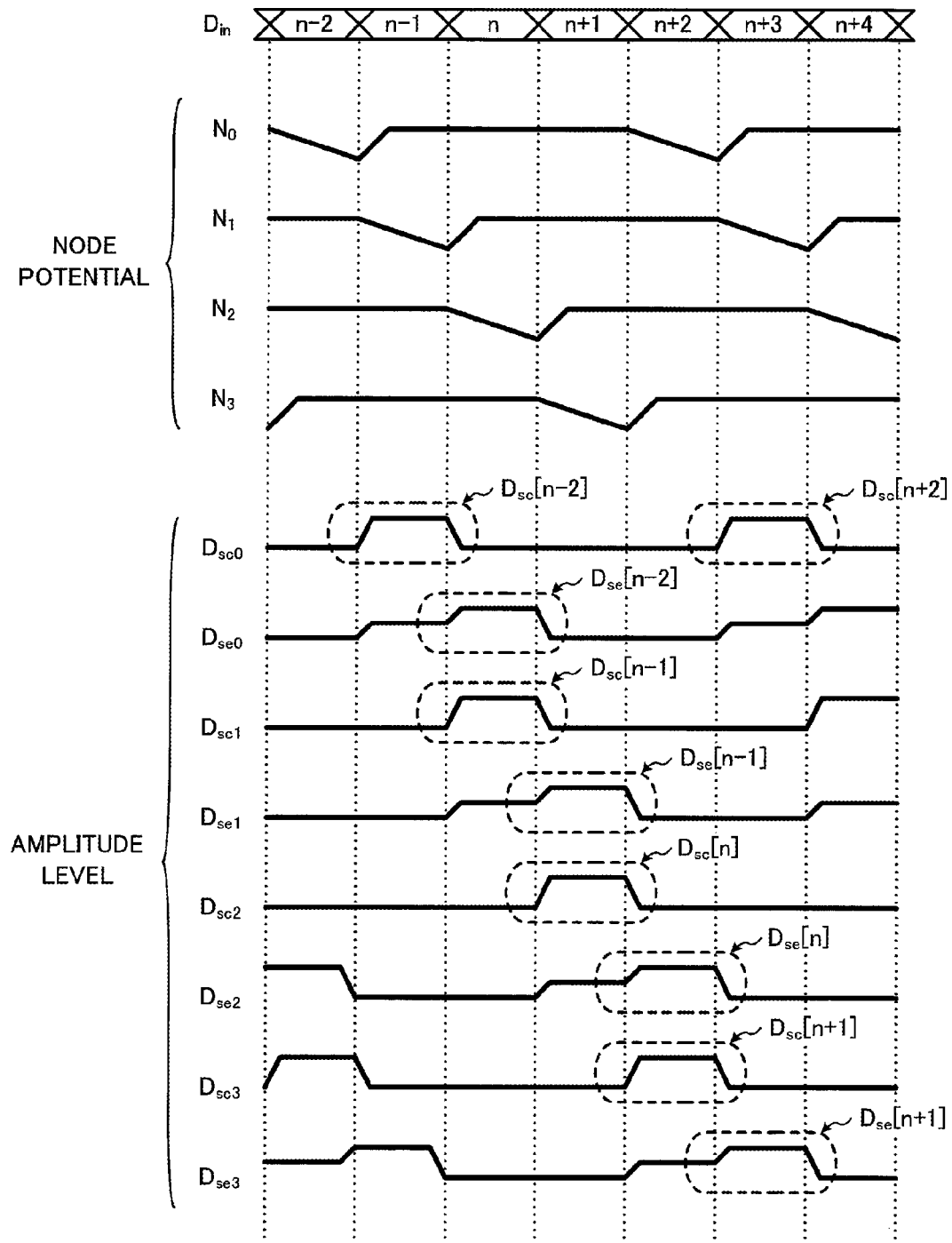
FIG. 15 indicates a change in node potential and a change in outputted amplitude level in the sampling circuits and the data interpolation circuits in the fourth embodiment.

In the example of FIG. 14, the operation of each switch in intervals corresponding to (n−2)th through (n+5)th bits of an input data signal $D_{in}$ is indicated. The sampling switch $SW_{s0}$ is in an on state in the interval (n−2). At this time the holding switch $SW_{h0}$ is in an off state and the resetting switch $SW_{r0}$ is in an off state. When the switch $SW_{s0}$ is turned on, electric charges are drawn out of the capacitances $C_1$, $C_2$, and $C_{12}$ connected to the switch $SW_{s0}$ by an amount corresponding to an amplitude level of the input data signal $D_{in}$, and the potential of the node $N_0$ falls (see node potential ($N_0$) in FIG. 15). However, the value of the capacitance $C_1$ is twice the values of the capacitances $C_2$ and $C_{12}$, so the amount of electric charges drawn out of the capacitances $C_2$ and $C_{12}$ is half of the amount of electric charges drawn out of the capacitance $C_1$.

The sampling switch $SW_{s0}$ is in an off state in the interval (n−1). On the other hand, the holding switch $SW_{h0}$ is in an on state in the interval (n−1). When the switch $SW_{h0}$ is turned on, power is supplied from the power supply connected to the switch $SW_{h0}$ and the potential of the node $N_0$ rises (see node potential ($N_0$) in FIG. 15). At this time the potential of the output terminal $c_{00}$ rises by the amount of electric charges drawn out of the capacitance $C_1$ in the interval (n−2) (see amplitude level ($D_{sc0}$) in FIG. 15). The amount of this rise in potential is a sampled amplitude level $D_{sc}[n-2]$ of the input data signal $D_{in}$. Furthermore, the potential of the output terminal $c_{01}$ also rises by the amount of electric charges drawn out of the capacitance $C_2$ in the interval (n−2).

The sampling switch $SW_{s1}$ is in an on state in the interval (n−1). At this time the holding switch $SW_{h1}$ is in an off state and the resetting switch $SW_{r1}$ is in an off state. When the switch $SW_{s1}$ is turned on, electric charges are drawn out of the capacitances $C_3$, $C_4$, and $c_5$ connected to the switch $SW_{s1}$ by an amount corresponding to an amplitude level of the input data signal $D_{in}$, and the potential of the node $N_1$ falls (see node potential ($N_1$) in FIG. 15). However, the value of the capacitance $C_4$ is twice the values of the capacitances $C_3$ and $C_5$, so the amount of electric charges drawn out of the capacitances $C_3$ and $C_5$ is half of the amount of electric charges drawn out of the capacitance $C_4$.

The sampling switch $SW_{s1}$ is in an off state in the interval n. On the other hand, the holding switch $SW_{h1}$ is in an on state in the interval n. When the switch $SW_{h1}$ is turned on, power is supplied from the power supply connected to the switch $SW_{h1}$ and the potential of the node $N_1$ rises (see node potential ($N_1$) in FIG. 15). At this time the potential of the output terminal $c_{10}$ rises by the amount of electric charges drawn out of the capacitance $C_4$ in the interval (n−1) (see amplitude level ($D_{sc1}$) in FIG. 15). The amount of this rise in potential is a sampled amplitude level $D_{sc}[n-1]$ of the input data signal $D_{in}$.

The potential of the output terminal $c_{01}$ rises further in the interval n by the amount of electric charges drawn out of the capacitance $C_3$ in the interval (n−1). At this time the holding switch $SW_{h0}$ also remains in an on state, so the potential of the output terminal $c_{01}$ rises by an amount of electric charges obtained by adding together the amount of electric charges drawn out of the capacitance $C_2$ in the interval (n−2) and the amount of electric charges drawn out of the capacitance $C_3$ in the interval (n−1). That is to say, a rise in potential corresponding to a value intermediate between the two amplitude levels $D_{sc0}$ and $D_{sc1}$ takes place at the output terminal $c_{01}$ (see amplitude level ($D_{se0}$) in FIG. 15). The amount of this rise in potential is an intermediate level $D_{se}[n-2]$.

The resetting switches $SW_{r0}$ ($SW_{r00}$ and $SW_{r01}$) are in an on state in the interval n and electric charges drawn out of the capacitance $C_1$ (and $c_{12}$) are reset. Furthermore, the resetting switches $SW_{r1}$ ($SW_{r10}$ and $SW_{r11}$) are in an on state in the interval (n+1) and electric charges drawn out of the capacitances $C_2$, $C_3$, and $C_4$ are reset. Circuit operations for finding the two amplitude levels $D_{sc}[n-2]$ and $D_{sc}[n-1]$ and the intermediate level $D_{se}[n-2]$ have been described. By making each switch operate at a timing indicated in FIG. 14, an amplitude level $D_{sc}$ in each interval and an intermediate level $D_{se}$ are obtained in order.

The examples of the sampling circuits 303a through 303d and the data interpolation circuits 306a through 306d in the fourth embodiment have been described. By applying the circuit illustrated in FIG. 13 and making each switch operate at a timing indicated in FIG. 14, the sampling of the input data signal $D_{in}$ and an interpolation process can be realized by the circuit having a small area.

(Example 2 of Receiver Circuit)

Figure 16:
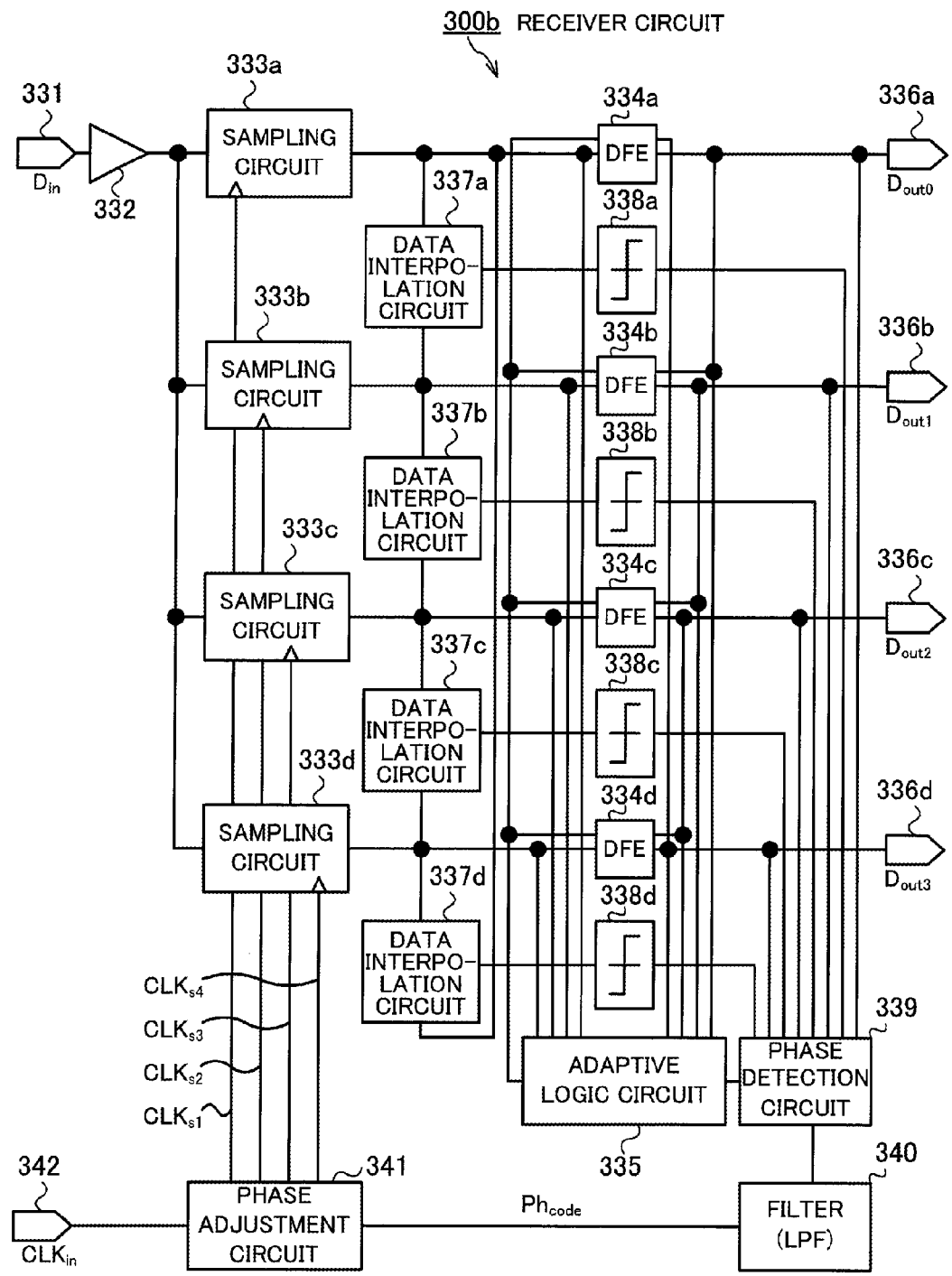
FIG. 16 is a second example of the receiver circuit according to the fourth embodiment.

Next, a receiver circuit 300b according to the fourth embodiment will be described with reference to FIG. 16. FIG. 16 is a second example of the receiver circuit according to the fourth embodiment. There are components in a receiver circuit 300b which have substantially the same functions as the components in the receiver circuit 200 according to the third embodiment have. Only the correspondences between these components in the receiver circuit 300b and the components in the receiver circuit 200 will be indicated and detailed description of these components in the receiver circuit 300b will be omitted.

As illustrated in FIG. 16, the receiver circuit 300b includes a data input terminal 331, an amplifier 332, sampling circuits 333a through 333d, equalizers 334a through 334d, an adaptive logic circuit 335, and data output terminals 336a through 336d. In addition, the receiver circuit 300b includes data interpolation circuits 337a through 337d, comparison circuits 338a through 338d, a phase detection circuit 339, a filter 340, a phase adjustment circuit 341, and a clock input terminal 342.

The data input terminal 331, the sampling circuits 333a through 333d, and the equalizers 334a through 334d are substantially the same as the data input terminal 201, the sampling circuit 202, and the equalizer 203, respectively, in the third embodiment. The adaptive logic circuit 335 and the data output terminals 336a through 336d are substantially the same as the adaptive logic circuit 204 and the data output terminal 205, respectively, in the third embodiment.

The data interpolation circuits 337a through 337d, the comparison circuits 338a through 338d, and the phase detection circuit 339 are substantially the same as the data interpolation circuit 206, the comparison circuit 207, and the phase detection circuit 208, respectively, in the third embodiment. The filter 340, the phase adjustment circuit 341, and the clock input terminal 342 are substantially the same as the filter 209, the phase adjustment circuit 210, and the clock input terminal 211, respectively, in the third embodiment. Furthermore, sampling clocks $CLK_{s1}$ through $CLK_{s4}$ supplied from the phase adjustment circuit 341 are the same as the sampling clocks $CLK_{s1}$ through $CLK_{s4}$, respectively, supplied from the phase adjustment circuit 310 included in the receiver circuit 300a.

As stated above, the components included in the receiver circuit 300b have substantially the same functions as the components included in the receiver circuit 200 according to the third embodiment have. In addition, a mechanism by which interleaved operation by the receiver circuit 300b is realized is substantially the same with the above receiver circuit 300a. Accordingly, detailed description of each component included in the receiver circuit 300b will be omitted.

The receiver circuit 300b according to the fourth embodiment has been described. The sampling circuits 333a through 333d and the data interpolation circuits 337a through 337d can be realized by the circuit which has already been described with reference to FIGS. 13 through 15. If this circuit is adopted, a group of circuits connected in parallel perform interleaved operation. Therefore, the operating speeds of individual circuits can be reduced and the receiver circuit 300b operates easily at a high data rate.

The fourth embodiment has been described.

(Reference Example (Receiver Circuit Including BR Phase Detector Having Amplitude Adjustment Function))

Figure 17:
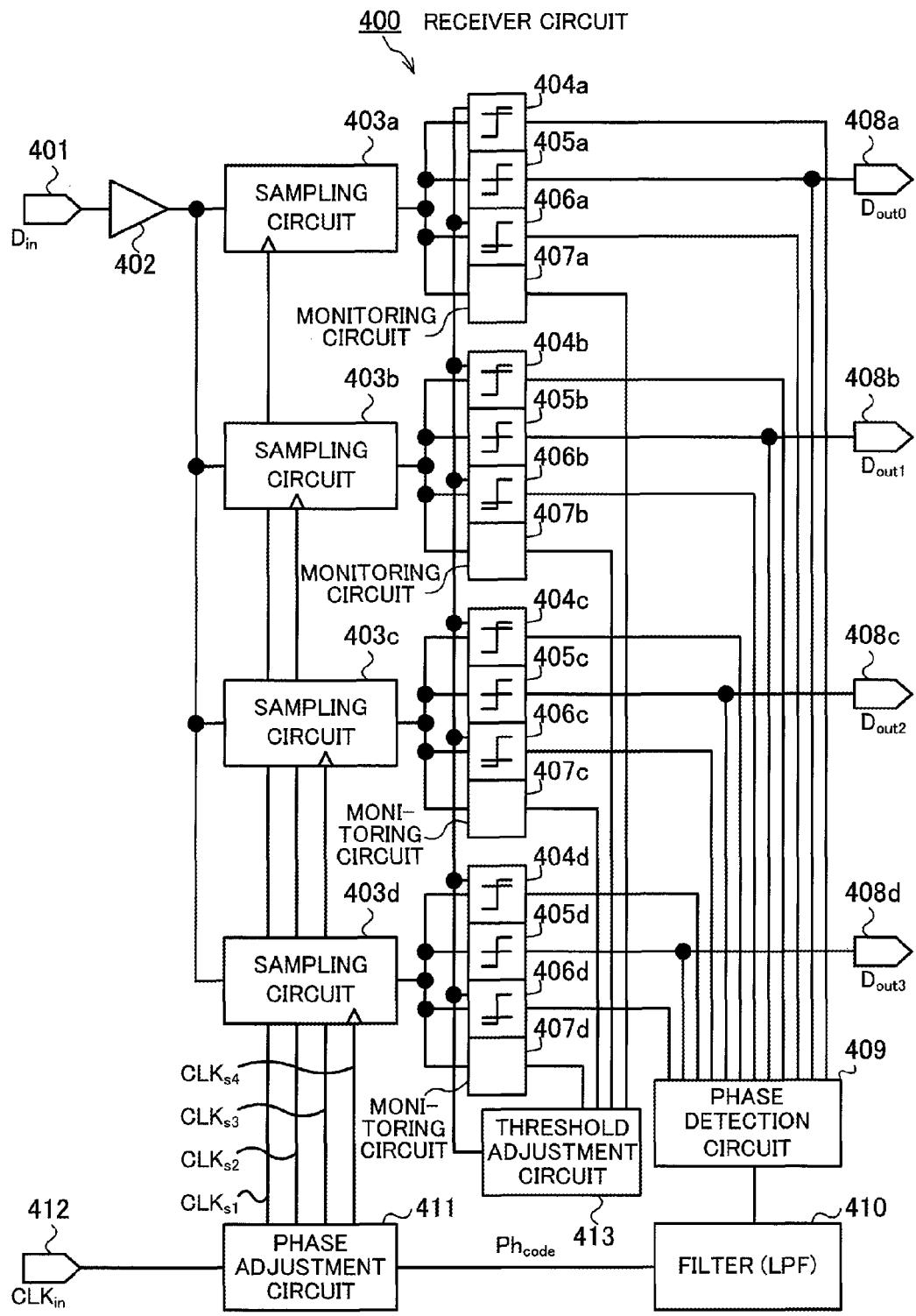
FIG. 17 is an example of a receiver circuit including a BR phase detector having an amplitude adjustment function.

For reference, a receiver circuit 400 which includes a BR phase detector and which can perform interleaved operation will now be described with reference to FIG. 17. FIG. 17 is an example of a receiver circuit including a BR phase detector having an amplitude adjustment function.

Unlike the above receiver circuits according to the first through fourth embodiments, a BR phase detector compares one amplitude level per bit obtained by sampling an input data signal with three thresholds to detect a phase deviation of a sampling clock. One of the three thresholds is set to a zero level and the other two thresholds are set to levels above and below the zero level. For example, the threshold set to a level above the zero level is indicated by "de+", the threshold set to the zero level is indicated by "dc", and the threshold set to a level below the zero level is indicated by "de−". Furthermore, a decision result obtained on the basis of the threshold de+ is indicated by $D_{de+}$, a decision result obtained on the basis of the threshold dc is indicated by $D_{dc}$, and a decision result obtained on the basis of the threshold de− is indicated by $D_{de-}$.

For example, if a combination of $D_{de+}[n-1]$, $D_{dc}[n-1]$, $D_{de-}[n-1]$, $D_{de+}[n]$, $D_{dc}[n]$, and $D_{de-}[n]$ is (001111) or (011000), then the BR phase detector decides that a phase of the sampling clock is slow. On the other hand, if the above combination is (000011) or (111001), then the BR phase detector decides that a phase of the sampling clock is fast. The BR phase detector makes a decision in this way on the basis of the thresholds de+ and de− set above and below the zero level. Accordingly, variations in the amplitude of an input data signal caused by the influence of transmission line loss, noise, or the like tend to have an influence on a decision result.

In order to reduce such an influence, the following method, for example, may be adopted. The amplitude of an input data signal is detected and a threshold is adjusted according to a detection result. A receiver circuit 400 including a BR phase detector having an amplitude adjustment function to which this method is applied is illustrated as an example in FIG. 17. In the example of FIG. 17, however, sampling circuits and the like are connected in parallel. This is the same with the above receiver circuits 300a and 300b according to the fourth embodiment. Accordingly, the receiver circuit 400 can perform interleaved operation.

In the example of FIG. 17, the receiver circuit 400 includes a data input terminal 401, an amplifier 402, sampling circuits 403a through 403d, first comparison circuits 404a through 404d, second comparison circuits 405a through 405d, and third comparison circuits 406a through 406d. In addition, the receiver circuit 400 includes monitoring circuits 407a through 407d, data output terminals 408a through 408d, a phase detection circuit 409, a filter 410, a phase adjustment circuit 411, a clock input terminal 412, and a threshold adjustment circuit 413.

An input data signal $D_{in}$ is inputted to the data input terminal 401. The input data signal $D_{in}$ is amplified by the amplifier 402 and is inputted to the sampling circuits 403a through 403d. The sampling circuits 403a through 403d sample the input data signal $D_{in}$ at sampling timings indicated by sampling clocks $CLK_{s1}$ through $CLK_{s4}$, respectively, supplied from the phase adjustment circuit 441.

An amplitude level $D_s$ of the input data signal $D_{in}$ sampled by the sampling circuit 403a is inputted to the first comparison circuit 404a, the second comparison circuit 405a, the third comparison circuit 406a, and the monitoring circuit 407a. An amplitude level $D_s$ of the input data signal $D_{in}$ sampled by the sampling circuit 403b is inputted to the first comparison circuit 404b, the second comparison circuit 405b, the third comparison circuit 406b, and the monitoring circuit 407b.

An amplitude level $D_s$ of the input data signal $D_{in}$ sampled by the sampling circuit 403c is inputted to the first comparison circuit 404c, the second comparison circuit 405c, the third comparison circuit 406c, and the monitoring circuit 407c. An amplitude level $D_s$ of the input data signal $D_{in}$ sampled by the sampling circuit 403d is inputted to the first comparison circuit 404d, the second comparison circuit 405d, the third comparison circuit 406d, and the monitoring circuit 407d.

The first comparison circuit 404a compares a first threshold de+ and the amplitude level $D_s$ and outputs a bit value $D_{de+}$ indicative of a comparison result. The second comparison circuit 405a compares a second threshold dc and the amplitude level $D_s$ and outputs a bit value $D_{dc}$ indicative of a comparison result. The third comparison circuit 406a compares a third threshold de− and the amplitude level $D_s$ and outputs a bit value $D_{de-}$ indicative of a comparison result. The second threshold dc is set to a zero level, the first threshold de+ is set a value greater than the second threshold dc, and the third threshold de− is set a value smaller than the second threshold dc.

The bit value $D_{de+}$ outputted from the first comparison circuit 404a is inputted to the phase detection circuit 409. The bit value $D_{dc}$ outputted from the second comparison circuit 405a is outputted as received data $D_{out0}$ from the data output terminal 408a to the outside of the receiver circuit 400 and is inputted to the phase detection circuit 409. The bit value $D_{de-}$ outputted from the third comparison circuit 406a is inputted to the phase detection circuit 409.

The monitoring circuit 407a monitors the amplitude level $D_s$ and decides whether or not the amplitude level $D_s$ is within a determined range. A first range centered at the first threshold de+ and a second range centered at the third threshold de− are set as the determined range. The width of the first range and the second range is set to a value (which is found in advance by experiments, for example) by which a phase deviation of a sampling clock can be detected with determined accuracy or higher on the basis of the bit values $D_{de+}$, $D_{dc}$, and $D_{de-}$.

For example, the width of the first range is set to about several percent of the first threshold de+ and the width of the second range is set to about several percent of the third threshold de−. If the amplitude level $D_s$ deviates from the determined range, then the monitoring circuit 407a inputs to the threshold adjustment circuit 413 a signal indicative of a direction (upward or downward) in which the deviation occurs and an amount of the deviation. If the amplitude level $D_s$ is within the determined range, then the monitoring circuit 407a inputs to the threshold adjustment circuit 413 a signal which indicates that deviation does not occur.

The sampling circuits 403b through 403d, the first comparison circuits 404b through 404d, the second comparison circuits 405b through 405d, the third comparison circuits 406b through 406d, and the monitoring circuits 407b through 407d operate in the same way. However, the first comparison circuits 404a through 404d use the same first threshold de+. The second comparison circuits 405a through 405d use the same second threshold dc. The third comparison circuits 406a through 406d use the same third threshold de−.

The threshold adjustment circuit 413 adjusts the first threshold de+ and the third threshold de− according to signals inputted from the monitoring circuits 407a through 407d. For example, if the amplitude level $D_s$ deviates upward from the first range, then the threshold adjustment circuit 413 shifts the first threshold de+ upward on the basis of an amount of the deviation so that the amplitude level $D_s$ will be within the first range. In addition, the threshold adjustment circuit 413 shifts the third threshold de− downward by the same amount that the threshold adjustment circuit 413 shifts the first threshold de+ by. On the other hand, if the amplitude level $D_s$ deviates downward from the first range, then the threshold adjustment circuit 413 shifts the first threshold de+ downward on the basis of an amount of the deviation so that the amplitude level $D_s$ will be within the first range. In addition, the threshold adjustment circuit 413 shifts the third threshold de− upward by the same amount that the threshold adjustment circuit 413 shifts the first threshold de+ by.

By adjusting the first threshold de+ and the third threshold de− in the above way, decision accuracy hardly deteriorates even if an amplitude level varies by the influence of transmission line loss, noise, or the like. As a result, the probability that a phase of the sampling clock is erroneously detected is decreased.

The phase detection circuit 409 detects a phase deviation of the sampling clock on the basis of the bit values $D_{de+}$, $D_{dc}$, and $D_{de−}$ inputted in order from the first comparison circuits 404a through 404d, the second comparison circuits 405a through 405d, and the third comparison circuits 406a through 406d. For example, an SSMMPD (Sign-Sign Mueller Muller Phase Detector) may be used as the phase detection circuit 409.

If a combination of $D_{de+}[n−1]$, $D_{dc}[n−1]$, $D_{de−}[n−1]$, $D_{de+}[n]$, $D_{dc}[n]$, and $D_{de−}[n]$ is (001111) or (011000), then the phase detection circuit 409 decides that a phase of the sampling clock is slow. In addition, if the above combination is (000011) or (111001), then the phase detection circuit 409 decides that a phase of the sampling clock is fast. If the phase detection circuit 409 decides that a phase of the sampling clock is slow, then the phase detection circuit 409 outputs an UP/DN signal whose value is "+1". If the phase detection circuit 409 decides that a phase of the sampling clock is fast, then the phase detection circuit 409 outputs an UP/DN signal whose value is "−1". In the other cases, the phase detection circuit 409 outputs an UP/DN signal whose value is "0".

The UP/DN signal outputted from the phase detection circuit 409 is inputted to the filter 410. The filter 410 removes a high-frequency component from the UP/DN signal and generates and outputs a phase code $Ph_{code}$. The phase code $Ph_{code}$ outputted from the filter 410 is inputted to the phase adjustment circuit 411. The phase adjustment circuit 411 adjusts a phase of a clock $CLK_{in}$ on the basis of the phase code $Ph_{code}$ and generates the sampling clocks $CLK_{s1}$ through $CLK_{s4}$ from the clock after the phase adjustment. The sampling clocks $CLK_{s1}$ through $CLK_{s4}$ generated by the phase adjustment circuit 411 are supplied to the sampling circuits 403a through 403d respectively.

The receiver circuit 400 which includes a BR phase detector and which can perform interleaved operation has been described. As stated above, the receiver circuit 400 has the function of adjusting the first threshold de+ and the third threshold de− by the threshold adjustment circuit 413, so the receiver circuit 400 is hardly influenced by variations in the amplitude of the input data signal $D_{in}$. This is the same with the receiver circuits according to the second through fourth embodiments. Furthermore, the receiver circuit 400 can perform interleaved operation, so the receiver circuit 400 can accommodate operation at a high data rate. However, the receiver circuits according to the second through fourth embodiments differ from the receiver circuit 400 in that they do not include the monitoring circuits 407a through 407d or the threshold adjustment circuit 413. Therefore, with the receiver circuits according to the second through fourth embodiments it is possible to make circuit scale smaller.

According to an aspect, a phase deviation can be detected by a smaller circuit with an amplitude level of a data signal at a zero-crossing point as reference.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A receiver circuit comprising:
a sampling circuit which detects an amplitude level of an input data signal at a sampling timing indicated by a sampling clock;
a first comparison circuit which compares a first amplitude level and a second amplitude level detected by the sampling circuit at a first sampling timing and a second sampling timing, respectively, with a determined threshold;
an interpolation circuit which calculates an intermediate level that approximates to an amplitude level of the input data signal corresponding to an intermediate point between the first sampling timing and the second sampling timing by an interpolation process based on the first amplitude level and the second amplitude level;
a second comparison circuit which compares the intermediate level with the determined threshold; and
a phase deviation detection circuit which detects a deviation of phase between the sampling clock and the input data signal on the basis of results of comparisons made by the first comparison circuit and the second comparison circuit.

2. The receiver circuit according to claim 1, wherein when a combination of a first bit value and a second bit value corresponding to the first amplitude level and the second amplitude level, respectively, and a third bit value and a fourth bit value corresponding to a third amplitude level and a fourth amplitude level detected by the sampling circuit at a third sampling timing and a fourth sampling timing, respectively, different from the first sampling timing and the second sampling timing does not form a determined pattern, the phase deviation detection circuit detects the deviation of phase.

3. The receiver circuit according to claim 2, wherein the determined pattern is a pattern in which bit value inversion is repeated periodically.

4. The receiver circuit according to claim 2, wherein:
when a slew rate of the input data signal is greater than a determined pattern decision threshold, the phase deviation detection circuit considers as the determined pattern a first pattern obtained by combining the first through fourth bit values; and when the slew rate of the input data signal is smaller than the determined pattern decision threshold, the phase deviation detection circuit considers as the determined pattern a second pattern obtained by combining the first bit value and the second bit value or a third pattern obtained by combining the first bit value, the second bit value, and the third bit value or the fourth bit value.

5. The receiver circuit according to claim 2, wherein:
when an interval between the first sampling timing and the second sampling timing is shorter than a determined pattern decision threshold, the phase deviation detection circuit considers as the determined pattern a first pattern obtained by combining the first through fourth bit values; and
when the interval between the first sampling timing and the second sampling timing is longer than the determined pattern decision threshold, the phase deviation detection circuit considers as the determined pattern a second pattern obtained by combining the first bit value and the second bit value or a third pattern obtained by combining the first bit value, the second bit value, and the third bit value or the fourth bit value.

6. The receiver circuit according to claim 4, wherein:
the first comparison circuit is a decision feedback equalizer; and
the slew rate is calculated from an equalization coefficient of the decision feedback equalizer.

7. The receiver circuit according to claim 1, wherein:
the interpolation circuit includes:
a first capacitance whose one end is connected to a first node whose potential corresponds to an amplitude level of the input data signal at the first sampling timing and whose other end is connected to a first output terminal;
a second capacitance whose one end is connected to the first node, whose other end is connected to a second output terminal, and whose capacitance value is half of a capacitance value of the first capacitance;
a third capacitance whose one end is connected to a second node whose potential corresponds to an amplitude level of the input data signal at the second sampling timing, whose other end is connected to the second output terminal, and whose capacitance value is half of the capacitance value of the first capacitance; and
a control circuit which exercises control so that the first node is kept at determined potential after reaching the potential corresponding to the amplitude level of the input data signal, and which exercises control so that the second node is kept at the determined potential after reaching the potential corresponding to the amplitude level of the input data signal,
wherein:
when control is exercised so that the first node is kept at the determined potential, potential outputted from the first output terminal is outputted as the first amplitude level; and
after control is exercised so that the second node is kept at the determined potential, potential outputted from the second output terminal is outputted as the intermediate level.

8. A semiconductor integrated circuit including a receiver circuit which can correct a deviation of phase between an input data signal and a sampling clock and a logic circuit which operates by the use of data and a clock outputted from the receiver circuit, the receiver circuit comprising:
a sampling circuit which detects an amplitude level of the input data signal at a sampling timing indicated by the sampling clock;
a first comparison circuit which compares a first amplitude level and a second amplitude level detected by the sampling circuit at a first sampling timing and a second sampling timing, respectively, with a determined threshold;
an interpolation circuit which calculates an intermediate level that approximates to an amplitude level of the input data signal corresponding to an intermediate point between the first sampling timing and the second sampling timing by an interpolation process based on the first amplitude level and the second amplitude level;
a second comparison circuit which compares the intermediate level with the determined threshold;
a phase deviation detection circuit which detects the deviation of phase between the sampling clock and the input data signal on the basis of results of comparisons made by the first comparison circuit and the second comparison circuit; and
a phase adjustment circuit which adjusts a phase of the sampling clock to correct the deviation of phase detected by the phase deviation detection circuit,
wherein:
the result of the comparison made by the first comparison circuit is inputted as the data to the logic circuit; and
the sampling clock whose phase is adjusted by the phase adjustment circuit is inputted as the clock to the logic circuit.

* * * * *